(12) United States Patent
Jinbo

(10) Patent No.: US 8,039,842 B2
(45) Date of Patent: Oct. 18, 2011

(54) THIN FILM TRANSISTOR AND DISPLAY DEVICE INCLUDING THIN FILM TRANSISTOR

(75) Inventor: Yasuhiro Jinbo, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 233 days.

(21) Appl. No.: 12/467,048

(22) Filed: May 15, 2009

(65) Prior Publication Data

US 2009/0289256 A1 Nov. 26, 2009

(30) Foreign Application Priority Data

May 22, 2008 (JP) ................................ 2008-134343

(51) Int. Cl.
H01L 29/786 (2006.01)
H01L 33/00 (2010.01)

(52) U.S. Cl. .................... 257/59; 257/57; 257/E29.291; 257/E33.004

(58) Field of Classification Search .................... 257/57, 257/59, E29.291, E37.004, E33.004
See application file for complete search history.

(56) References Cited

U.S. PATENT DOCUMENTS

| | | | |
|---|---|---|---|
| 4,409,134 A | 10/1983 | Yamazaki | |
| 5,101,242 A | 3/1992 | Ikeda et al. | |
| 5,221,631 A | 6/1993 | Ikeda et al. | |
| 5,473,168 A | 12/1995 | Kawai et al. | |
| 5,726,461 A * | 3/1998 | Shimada et al. | 257/59 |
| 5,864,150 A | 1/1999 | Lin | |
| 6,153,893 A | 11/2000 | Inoue et al. | |
| 6,468,839 B2 | 10/2002 | Inoue et al. | |
| 7,332,382 B2 * | 2/2008 | Han | 438/149 |
| 7,812,348 B2 * | 10/2010 | Dairiki et al. | 257/59 |
| 7,821,012 B2 * | 10/2010 | Jinbo | 257/72 |
| 2001/0014493 A1 | 8/2001 | Inoue et al. | |
| 2004/0188685 A1 * | 9/2004 | Lin et al. | 257/66 |
| 2005/0115930 A1 | 6/2005 | Tanaka et al. | |
| 2009/0033818 A1 | 2/2009 | Nakajima et al. | |
| 2009/0057683 A1 | 3/2009 | Nakajima et al. | |
| 2009/0061574 A1 | 3/2009 | Nakajima et al. | |
| 2009/0218576 A1 | 9/2009 | Dairiki et al. | |
| 2009/0242889 A1 * | 10/2009 | Nakayama | 257/59 |

(Continued)

FOREIGN PATENT DOCUMENTS

EP 0 535 979 A2 4/1993

(Continued)

Primary Examiner — N Drew Richards
Assistant Examiner — Robert Carpenter
(74) Attorney, Agent, or Firm — Nixon Peabody LLP; Jeffrey L. Costellia

(57) ABSTRACT

A thin film transistor with favorable electric characteristics is provided, which includes a gate electrode layer; a first insulating layer covering the gate electrode layer; a pair of impurity semiconductor layers forming source and drain regions, which are provided with a distance therebetween and at least partly overlap with the gate electrode layer; a microcrystalline semiconductor layer which is provided over the first insulating layer in part of a channel formation region, and at least partly overlaps with the gate electrode layer and does not overlap with at least one of the pair of impurity semiconductor layers; a second insulating layer between and in contact with the first insulating layer and the microcrystalline semiconductor layer; and an amorphous semiconductor layer over the first insulating layer, covering the second insulating layer and the microcrystalline semiconductor layer. The first insulating layer is a silicon nitride layer and the second insulating layer is a silicon oxynitride layer.

36 Claims, 12 Drawing Sheets

U.S. PATENT DOCUMENTS

2009/0267067 A1 * 10/2009 Jinbo et al. .................. 257/57
2011/0017992 A1 * 1/2011 Jinbo .......................... 257/51

FOREIGN PATENT DOCUMENTS

| JP | 02-218166 | 8/1990 |
|----|-----------|--------|
| JP | 5-129608 | 5/1993 |
| JP | 7-131030 | 5/1995 |
| JP | 07-047876 | 11/1995 |
| JP | 2001-053283 | 2/2001 |
| JP | 2005-049832 | 2/2005 |
| JP | 2005-191546 | 7/2005 |

* cited by examiner

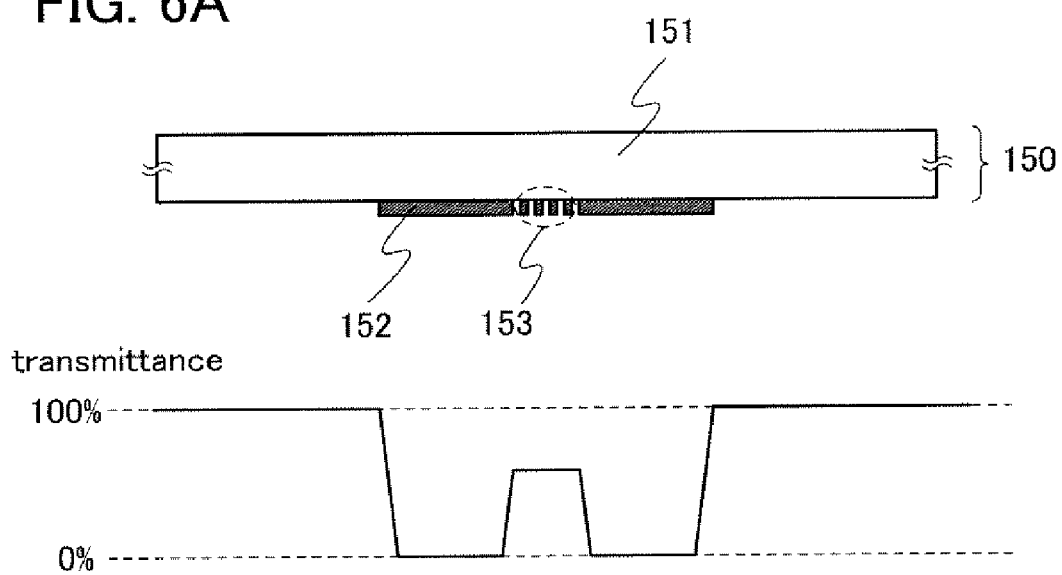
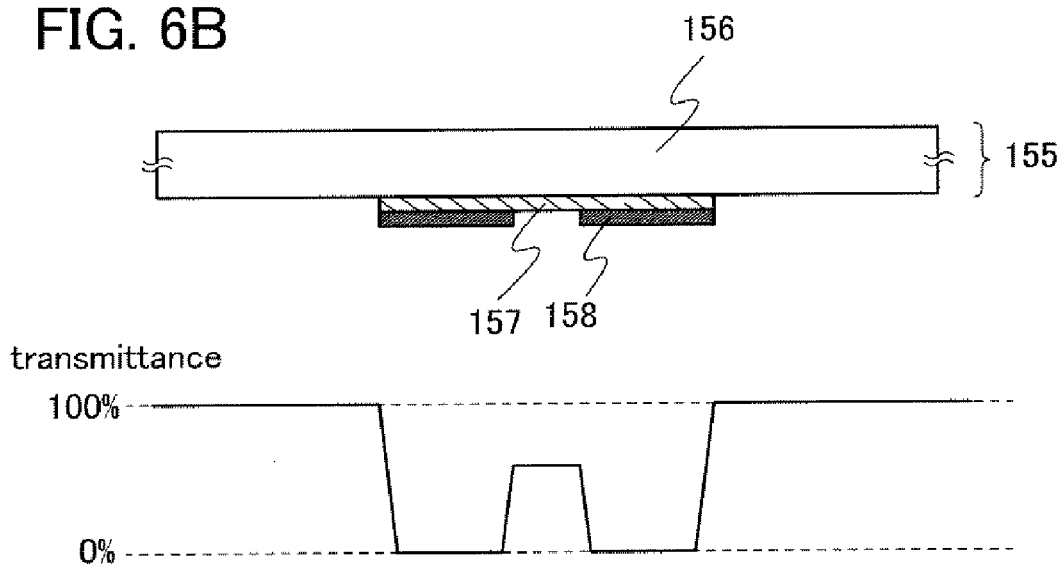

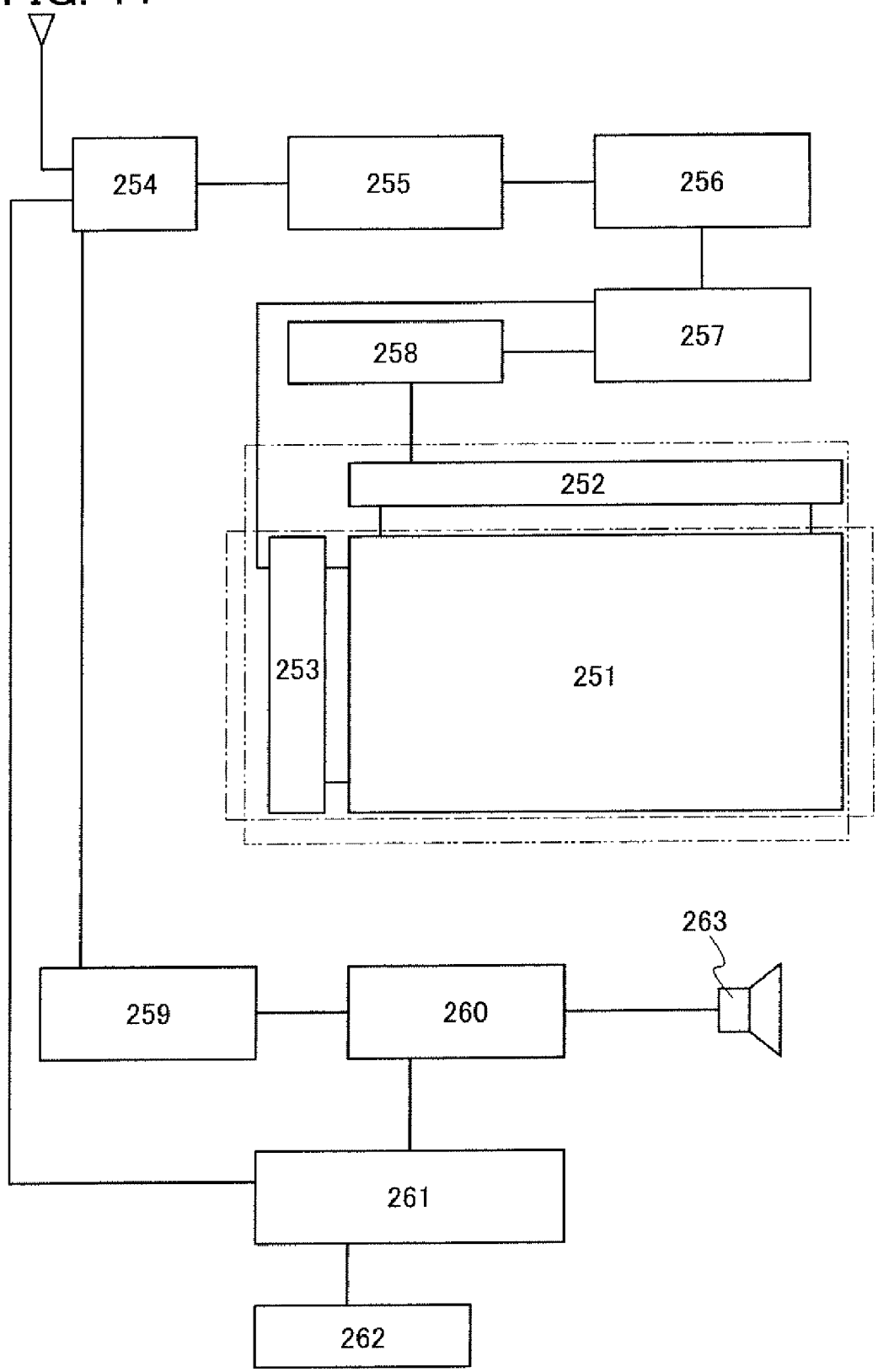

THIN FILM TRANSISTOR AND DISPLAY DEVICE INCLUDING THIN FILM TRANSISTOR

BACKGROUND OF THE INVENTION

1. Field of the Invention

The present invention relates to a thin film transistor and a display device to which the thin film transistor is applied.

2. Description of the Related Art

As one kind of field-effect transistors, there is known a thin film transistor in which a semiconductor layer provided over a substrate having an insulating surface is used for a channel formation region. Techniques by which amorphous silicon, microcrystalline silicon, and polycrystalline silicon are used for semiconductor layers of thin film transistors have been disclosed (see Patent Documents 1 to 5). Thin film transistors have been used for, for example, liquid crystal television devices and put into practical use as switching transistors for pixels of display screens.

[Reference]
[Patent Document]
[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546

SUMMARY OF THE INVENTION

A thin film transistor in which an amorphous silicon layer is used for a channel formation region has problems of low field-effect mobility (about 0.4 to 0.8 $cm^2/V \cdot sec$) and low on current. On the other hand, a thin film transistor in which a microcrystalline silicon layer is used for a channel formation region has higher field-effect mobility than the thin film transistor in which an amorphous silicon layer is used for a channel formation region. However, the thin film transistor in which a microcrystalline silicon layer is used for a channel formation region has high off current along with high on current and therefore cannot have sufficient switching characteristics.

A thin film transistor in which a polycrystalline silicon layer is used for a channel formation region has much higher field-effect mobility and higher on current than the aforementioned two kinds of thin film transistors. Therefore, the thin film transistor in which a polycrystalline silicon layer is used for a channel formation region can be used as not only a switching transistor provided in a pixel but also a transistor for a driver circuit which needs to operate at high speed.

However, a process for manufacturing the thin film transistor in which a polycrystalline silicon layer is used for a channel formation region needs a step of crystallizing a semiconductor layer. As a result, the manufacturing cost thereof becomes higher than those of the thin film transistor including an amorphous silicon layer and the thin film transistor including a microcrystalline silicon layer, which is a problem. Moreover, there is also a problem in that when a laser annealing technique is used for the crystallization of the semiconductor layer, large-screen liquid crystal panels cannot be efficiently manufactured because a laser beam irradiation area is small.

A glass substrate used for manufacturing a display panel has grown in size from year to year. In the beginning, the first generation (for example, 320 mm×400 mm) has been used. Now, even the eighth generation (for example, 2200 mm×2400 mm) is used. From now, the substrate is expected to grow in size further to the ninth generation (for example, 2400 mm×2800 mm) and the tenth generation (for example, 2950 mm×3400 mm). However, a technique is not established yet for manufacturing thin film transistors capable of high-speed operation (for example, the aforementioned thin film transistor including a polycrystalline silicon layer) over a large-sized glass substrate with high productivity. As for a technique for manufacturing thin film transistors capable of high-speed operation over a large-sized substrate, technique development has been advanced on a thin film transistor in which microcrystalline silicon is used for a channel formation region but its characteristics are not sufficient yet.

In view of the above, it is an object of an embodiment of the present invention to solve the aforementioned problems about on current and off current of a thin film transistor. It is another object of an embodiment of the present invention to provide a thin film transistor capable of high-speed operation.

According to an embodiment of the present invention, a thin film transistor includes a gate electrode layer; a first insulating layer which is provided so as to cover the gate electrode layer; a pair of impurity semiconductor layers forming a source region and a drain region, which are provided with a distance therebetween and which at least partly overlap with the gate electrode layer, a microcrystalline semiconductor layer which is provided over the first insulating layer in part of a channel formation region, and which at least partly overlaps with the gate electrode layer and does not overlap with the pair of impurity semiconductor layers; a second insulating layer which is provided between and in contact with the first insulating layer and the microcrystalline semiconductor layer; and an amorphous semiconductor layer which is provided over the first insulating layer so as to cover the second insulating layer and the microcrystalline semiconductor layer. Note that the first insulating layer is a silicon nitride layer and the second insulating layer is a silicon oxynitride layer.

According to another embodiment of the present invention, a thin film transistor includes a gate electrode layer; a first insulating layer which is provided so as to cover the gate electrode layer; an amorphous semiconductor layer which is provided over the first insulating layer so as to be at least partly in contact with the first insulating layer; a pair of impurity semiconductor layers forming a source region and a drain region, which are provided with a distance therebetween over the amorphous semiconductor layer; a microcrystalline semiconductor layer which is provided between the first insulating layer and the amorphous semiconductor layer in part of a channel formation region, and which at least partly overlaps with the gate electrode layer and does not overlap with the pair of impurity semiconductor layers; and a second insulating layer which is provided between and in contact with the first insulating layer and the microcrystalline semiconductor layer. Note that the first insulating layer is a silicon nitride layer and the second insulating layer is a silicon oxynitride layer.

According to another embodiment of the present invention, a thin film transistor includes a gate electrode layer; a first insulating layer which is provided so as to cover the gate electrode layer; a microcrystalline semiconductor layer which is provided over the first insulating layer and which at least partly overlaps with the gate electrode layer; an amorphous semiconductor layer which is provided so as to cover at least the microcrystalline semiconductor layer; a pair of impurity semiconductor layers forming a source region and a drain region, which are provided over the amorphous semiconductor layer and which do not overlap with the microcrystalline semiconductor layer; and a second insulating layer which is provided between and in contact with the first insulating layer and the microcrystalline semiconductor layer. Note that the first insulating layer is a silicon nitride layer and the second insulating layer is a silicon oxynitride layer.

According to another embodiment of the present invention, a thin film transistor includes a gate electrode layer; a first insulating layer which is provided so as to cover the gate electrode layer; a pair of impurity semiconductor layers forming a source region and a drain region, which are provided with a distance therebetween and which at least partly overlap with the gate electrode layer; a microcrystalline semiconductor layer which is provided over the first insulating layer in part of a channel formation region, and which at least partly overlaps with the gate electrode layer and one of the pair of impurity semiconductor layers and does not overlap with the other of the pair of impurity semiconductor layers; a second insulating layer which is provided between and in contact with the first insulating layer and the microcrystalline semiconductor layer; and an amorphous semiconductor layer which is provided over the first insulating layer so as to cover the second insulating layer and the microcrystalline semiconductor layer. Note that the first insulating layer is a silicon nitride layer and the second insulating layer is a silicon oxynitride layer.

According to another embodiment of the present invention, a thin film transistor includes a gate electrode layer; a first insulating layer which is provided so as to cover the gate electrode layer; an amorphous semiconductor layer which is provided over the first insulating layer so as to be at least partly in contact with the first insulating layer; a pair of impurity semiconductor layers forming a source region and a drain region, which are provided with a distance therebetween over the amorphous semiconductor layer; a microcrystalline semiconductor layer which is provided between the first insulating layer and the amorphous semiconductor layer in part of a channel formation region, and which at least partly overlaps with the gate electrode layer and one of the pair of impurity semiconductor layers and does not overlap with the other of the pair of impurity semiconductor layers; and a second insulating layer which is provided between and in contact with the first insulating layer and the microcrystalline semiconductor layer. Note that the first insulating layer is a silicon nitride layer and the second insulating layer is a silicon oxynitride layer.

According to another embodiment of the present invention, a thin film transistor includes a gate electrode layer; a first insulating layer which is provided so as to cover the gate electrode layer; a microcrystalline semiconductor layer which is provided over the first insulating layer and which at least partly overlaps with the gate electrode layer; an amorphous semiconductor layer which is provided so as to cover at least the microcrystalline semiconductor layer; a pair of impurity semiconductor layers forming a source region and a drain region, which are provided over the amorphous semiconductor layer such that one of the pair of impurity semiconductor layers overlaps with the microcrystalline semiconductor layer and the other does not overlap with the microcrystalline semiconductor layer; and a second insulating layer which is provided between and in contact with the first insulating layer and the microcrystalline semiconductor layer. Note that the first insulating layer is a silicon nitride layer and the second insulating layer is a silicon oxynitride layer.

In a conventional thin film transistor, in general, the flow of carriers (electrons or holes) between a source region and a drain region is controlled by voltage applied to a gate electrode (difference in potential between the gate electrode and the source region) and the carriers flow through a semiconductor layer from the source region to the drain region. However, in the thin film transistor having any of the above structures, carriers flow between the source region and the drain region through the microcrystalline semiconductor layer provided so as to overlap with the gate electrode layer and through the amorphous semiconductor layer which is provided over the microcrystalline semiconductor layer so as to extend in a channel length direction.

In the thin film transistor having any of the above structures, the microcrystalline semiconductor layer is provided not throughout the channel formation region of the thin film transistor but in part of the channel formation region, and another part of the channel formation region is constituted by the amorphous semiconductor layer. That is to say, in the thin film transistor having any of the above structures, as for a certain distance between the source region and the drain region in the channel length direction, carriers, which flow through the channel, flow through the amorphous semiconductor layer.

In the thin film transistor having any of the above structures, the first insulating layer is a silicon nitride layer and the second insulating layer is a silicon oxynitride layer. That is to say, in the region where carriers flow, a silicon nitride layer is provided below and in contact with the amorphous semiconductor layer and a silicon oxynitride layer is provided below and in contact with the microcrystalline semiconductor layer. This is for the purpose of avoiding the following two problems.

The first problem is that the use of a silicon oxynitride layer as a gate insulating layer for a thin film transistor using the amorphous semiconductor layer as a channel formation region causes the threshold voltage of the transistor to shift to a positive potential side and moreover causes the subthreshold swing (also referred to as S value) to increase.

The second problem is that it is difficult to form the microcrystalline semiconductor layer over a silicon nitride layer because peeling of the microcrystalline semiconductor layer or the like is likely to occur. Moreover, if the microcrystalline semiconductor layer is formed over a silicon nitride layer, the crystallinity of the microcrystalline semiconductor layer tends to be lowered compared to the case where the microcrystalline semiconductor layer is formed over a silicon oxynitride layer.

In the thin film transistor having any of the above structures of the present invention, donor concentration in the microcrystalline semiconductor layer is preferably as high as possible and is preferably $1 \times 10^{18}$ to $1 \times 10^{21}$ cm$^{-3}$ inclusive because the increase in donor concentration in the microcrystalline semiconductor layer leads to higher field-effect mobility, which allows high-speed operation.

Note that a silicon oxynitride layer means a layer that includes more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide layer means a layer that includes more nitrogen than oxygen, and in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms included in the silicon oxynitride layer or the silicon nitride oxide layer is defined as 100 at. %.

In the thin film transistor having any of the above structures, the first insulating layer is formed to be thick in a region where the first insulating layer overlaps with the second insulating layer and a side surface of the microcrystalline semiconductor layer is preferably aligned substantially with a side surface of the second insulating layer. This is because the second insulating layer and the microcrystalline semiconductor layer are patterned in one etching step and moreover because many of the main components of the first insulating layer and the second insulating layer are the same and further, the amorphous semiconductor layer and the like are formed so as to cover the second insulating layer and the microcrystalline semiconductor layer.

It is preferable that the microcrystalline semiconductor layer have an electric conductivity of $1\times10^{-5}$ to $5\times10^{-2}$ $S \cdot cm^{-1}$ inclusive, and the amorphous semiconductor layer have a lower electric conductivity than the microcrystalline semiconductor layer. The microcrystalline semiconductor layer is provided at least in part of the channel formation region of the thin film transistor and causes high on current due to the electric conductivity in the aforementioned range. On the other hand, the amorphous semiconductor layer which forms part of a channel formation region to form a so-called offset region contributes to decrease in off current.

The impurity semiconductor refers to a semiconductor in which a majority of carriers contributing to electrical conduction are supplied from an impurity element having one conductivity type which has been added to the semiconductor. The impurity element having one conductivity type is an element which can be a donor for supplying electrons as carriers or an acceptor for supplying holes as carriers. As a typical example of the donor, there is a Group 15 element in the periodic table. As a typical example of the acceptor, there is a Group 13 element in the periodic table. It is preferable to add an impurity element serving as a donor to the microcrystalline semiconductor layer, in order to improve the mobility of the microcrystalline semiconductor.

Note that the microcrystalline semiconductor refers to, for example, a semiconductor which has a crystal grain with a diameter of 2 to 200 nm inclusive, preferably 10 to 80 nm inclusive, more preferably 20 to 50 nm inclusive and which has an electric conductivity of approximately $10^{-7}$ to $10^{-4}$ $S \cdot cm^{-1}$ that can be increased to approximately $10^1$ $S \cdot cm^{-1}$ by valence electron control. However, concepts of the microcrystalline semiconductor are not limited to only the above-described crystal grain diameters and values of the electric conductivity. The concepts of the microcrystalline semiconductor are not necessarily limited to the above-described grain diameters and the like as long as the microcrystalline semiconductor has similar physical property values.

Note that the amorphous semiconductor refers to a semiconductor without a crystal structure (without long-range order in atomic arrangement). As the amorphous semiconductor, for example, amorphous silicon can be used, and amorphous silicon may include hydrogen or the like.

On current refers to a current that flows between a source region and a drain region, that is, through a channel formation region when appropriate gate voltage is applied to a gate electrode so that current flows through the channel formation region (that is, when the thin film transistor is turned on).

Here, an on state refers to a state where an absolute value of gate voltage (difference in potential between the gate electrode and the source region) exceeds an absolute value of the threshold voltage of a transistor.

In addition, off current refers to a current that flows between a source region and a drain region, that is, through a channel formation region when an absolute value of gate voltage of a thin film transistor is lower than an absolute value of the threshold voltage (that is, when the thin film transistor is turned off).

The microcrystalline semiconductor layer is provided in part of the channel formation region, and as for a certain distance of the channel formation region, carriers flow through the amorphous semiconductor layer. This structure can achieve a thin film transistor with excellent switching characteristics, that is, high on current and low off current.

A semiconductor layer with high crystallinity can be formed by provision of a silicon oxynitride layer as an insulating layer that is in contact with a microcrystalline semiconductor layer.

A silicon nitride layer is provided as an insulating layer that is in contact with an amorphous semiconductor layer and a silicon oxynitride layer is provided as an insulating layer that is in contact with a microcrystalline semiconductor layer. Thus, a thin film transistor with low subthreshold swing, threshold voltage that does not shift (or the amount of the shift is small), and favorable electric characteristics can be provided.

BRIEF DESCRIPTION OF THE DRAWINGS

FIGS. 6A and 6B illustrate the manufacturing method of the thin film transistor.
FIG. 11 illustrates an example of an electronic device.

DETAILED DESCRIPTION OF THE INVENTION

Figure 1A:
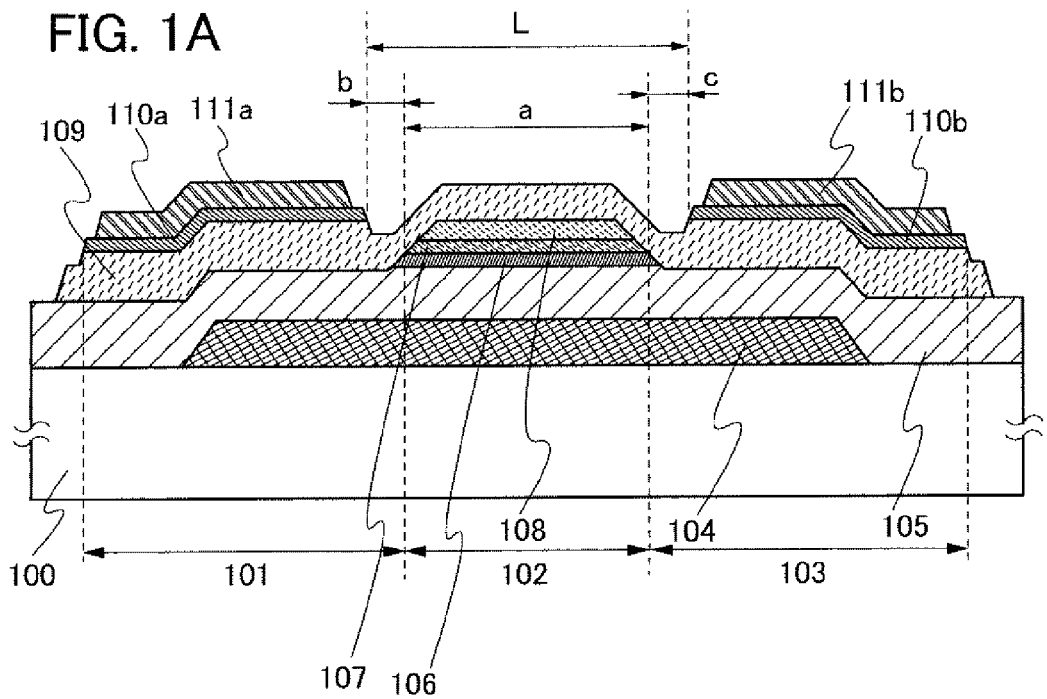
FIGS. 1A and 1B each illustrate a thin film transistor.

Hereinafter, embodiments of the present invention will be described in detail with reference to the accompanying drawings. Note that the present invention is not limited to the following description and it is easily understood by those skilled in the art that modes and details thereof can be variously modified without departing from the spirit and the scope of the present invention. Therefore, the present invention should not be construed as being limited to the following description of the embodiments. Note that the same reference numerals are used for the same portions through the drawings in the structures of the present invention to be described below. The same hatching pattern is applied to similar parts,

Embodiment 1

In Embodiment 1, examples of a structure of a thin film transistor according to an embodiment of the present invention will be described with reference to FIGS. 1A and 1B.

A thin film transistor illustrated in FIG. 1A includes a gate electrode layer 104 which is provided over a substrate 100; a first insulating layer 105 which is provided so as to cover the gate electrode layer 104; an impurity semiconductor layer 110a and an impurity semiconductor layer 110b forming a source region and a drain region, which are provided with a distance therebetween and which at least partly overlap with the gate electrode layer 104; a microcrystalline semiconductor layer 107 which is provided over the first insulating layer 105 in part of a channel formation region, and which at least partly overlaps with the gate electrode layer 104 and does not overlap with the impurity semiconductor layer 110a or 110b; a second insulating layer 106 which is provided between and in contact with the first insulating layer 105 and the microcrystalline semiconductor layer 107; and an amorphous semiconductor layer 109 which is provided over the first insulating layer 105 so as to cover the second insulating layer 106 and the microcrystalline semiconductor layer 107.

Specifically, the thin film transistor illustrated in FIG. 1A includes the gate electrode layer 104 which is provided over the substrate 100; the first insulating layer 105 which is provided so as to cover the gate electrode layer 104; the amorphous semiconductor layer 109 which is provided over the first insulating layer 105 so as to be at least partly in contact with the first insulating layer 105; the impurity semiconductor layer 110a and the impurity semiconductor layer 110b forming a source region and a drain region, which are provided with a distance therebetween over the amorphous semiconductor layer 109; the microcrystalline semiconductor layer 107 which is provided between the first insulating layer 105 and the amorphous semiconductor layer 109 in part of the channel formation region, and which at least partly overlaps with the gate electrode layer 104 and does not overlap with the impurity semiconductor layer 110a or 110b; and the second insulating layer 106 which is provided between and in contact with the first insulating layer 105 and the microcrystalline semiconductor layer 107.

In other words, the thin film transistor illustrated in FIG. 1A includes the gate electrode layer 104; the first insulating layer 105 which is provided so as to cover the gate electrode layer 104; the microcrystalline semiconductor layer 107 which is provided over the first insulating layer 105 and which at least partly overlaps with the gate electrode layer 104; the amorphous semiconductor layer 109 which is provided so as to cover at least the microcrystalline semiconductor layer 107; the impurity semiconductor layer 110a and the impurity semiconductor layer 110b forming a source region and a drain region, which are provided over the amorphous semiconductor layer 109 and which do not overlap with the microcrystalline semiconductor layer 107; and the second insulating layer 106 which is provided between and in contact with the first insulating layer 105 and the microcrystalline semiconductor layer 107.

Note that a buffer layer 108 is provided over the microcrystalline semiconductor layer 107 in FIG. 1A as a preferable mode.

Further, a wiring layer 111a and a wiring layer 111b are provided over the impurity semiconductor layer 110a and the impurity semiconductor layer 110b, respectively.

Each layer in the thin film transistor illustrated in FIG. 1A will be described below.

As the substrate 100, any of the following substrates can be used: a non-alkaline glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Moreover, a substrate obtained by providing an insulating layer over a surface of a metal substrate such as a stainless steel alloy substrate may also be used. In addition, the substrate 100 can have any size.

The gate electrode layer 104 may be formed using a conductive material, for example, a metal material. As examples of the metal material that can be used, there are aluminum, chromium, titanium, tantalum, molybdenum, copper, and the like. The gate electrode layer 104 is preferably formed using a stacked film in which such a metal material, e.g., aluminum is sandwiched between barrier metals. As the barrier metal, a refractory metal such as titanium, molybdenum, or chromium is used. The barrier metal is provided for the purpose of preventing hillock, oxidation, and the like of aluminum. In the case where plural kinds of the metal layers are in contact with each other, a combination which reduces contact resistance is preferable.

The gate electrode layer 104 is preferably formed to a thickness of 50 to 300 nm inclusive, since it forms a gate wiring. The thickness of 50 to 100 nm inclusive of the gate electrode layer 104 can prevent disconnection of a semiconductor layer and a wiring, which are formed later. Further, the thickness of 150 to 300 nm inclusive of the gate electrode layer 104 can effectively lower the resistance of the gate wiring and enlarge a screen of a display.

Note that since a semiconductor layer and an insulating layer are formed over the gate electrode layer 104, it is preferable that the gate electrode layer 104 be processed so that end portions thereof are tapered. By the same manufacturing steps as those of the gate electrode layer 104, not only the gate wiring but also a capacitor wiring can be formed.

The first insulating layer 105 is formed using silicon nitride. When the first insulating layer 105 is a silicon nitride layer, there are the following advantages: the subthreshold swing of the thin film transistor can be reduced since the first insulating layer 105 serves as a gate insulating layer for a thin film transistor using the amorphous semiconductor layer 109 as a channel formation region; the adhesion between the substrate 100 and the first insulating layer 105 can be increased; and impurity elements such as sodium included in the substrate 100 can be prevented from entering the microcrystalline semiconductor layer 107, the buffer layer 108, and the amorphous semiconductor layer 109. Furthermore, oxidation of the gate electrode layer 104 can be prevented.

The first insulating layer 105 is preferably formed to a thickness of 50 to 150 nm inclusive. The gate electrode layer 104 is generally formed by a sputtering method and the surface thereof is likely to be uneven. The first insulating layer 105 having a thickness of 50 to 150 nm inclusive makes it possible to suppress reduction in coverage due to the unevenness.

Therefore, by forming the first insulating layer 105 using silicon nitride to a thickness of 50 to 150 nm inclusive, peeling of the layer can be prevented, whereby electric characteristics of a thin film transistor which is formed later can be favorable.

The microcrystalline semiconductor layer 107 is formed using a microcrystalline semiconductor and the resistivity thereof is preferably in the range of 0.9 to 2 S·cm$^{-1}$.

The microcrystalline semiconductor is a semiconductor having an intermediate structure between an amorphous structure and a crystalline structure (including a single crystal and a polycrystal). In general, the microcrystalline semiconductor has a third state that is stable in terms of free energy, and is a crystalline semiconductor which has short-range order and lattice distortion. In the microcrystalline semiconductor, column-like or needle-like crystals each with a grain diameter of 2 to 200 nm inclusive, preferably 10 to 80 nm inclusive, more preferably 20 to 50 nm inclusive are grown in the direction of a normal line with respect to the surface of the substrate. The microcrystalline semiconductor has an electric conductivity of approximately $10^{-7}$ to $10^{-4}$ S·cm$^{-1}$ that can be increased to approximately $10^1$ S·cm$^{-1}$ by valence electron control. Microcrystalline silicon, which is a typical example of the microcrystalline semiconductor, has a peak of Raman spectrum which is shifted to a lower wave number side than 520 cm$^{-1}$ that represents single crystal silicon. That is to say, the peak of a Raman spectrum of microcrystalline silicon lies between 520 cm$^{-1}$ and 480 cm$^{-1}$, which represent single crystal silicon and amorphous silicon, respectively. In addition, the microcrystalline semiconductor preferably includes hydrogen or halogen of at least 1 at. % in order to terminate a dangling bond. Moreover, when a rare gas element such as helium, argon, krypton, or neon is added to further promote lattice distortion, a favorable microcrystalline semiconductor with higher crystal stability can be obtained. The description of such a microcrystalline semiconductor is disclosed in, for example, U.S. Pat. No. 4,409,134. However, concepts of the microcrystalline semiconductor are not limited to only the above-described crystal grain diameters and values of the electric conductivity. The concepts of microcrystalline semiconductor are not necessarily limited to the above-described grain diameters and the like as long as the microcrystalline semiconductor has similar physical property values.

The thickness of the microcrystalline semiconductor layer 107 may be 5 to 50 nm inclusive, preferably 5 to 30 nm inclusive.

It is preferable that an impurity element serving as a donor be added to the microcrystalline semiconductor layer 107 in order to obtain sufficient on current. In this case, the oxygen concentration and the nitrogen concentration are each preferably less than ten times that of the impurity element serving as a donor, typically less than $3 \times 10^{19}$ cm$^{-3}$, preferably less than $3 \times 10^{18}$ cm$^{-3}$, and the carbon concentration is preferably less than or equal to $3 \times 10^{18}$ cm$^{-3}$. If oxygen or nitrogen exists in the microcrystalline semiconductor layer, crystallization of the semiconductor is interrupted. Therefore, in the case where the semiconductor layer to which the impurity element serving as a donor is added is the microcrystalline semiconductor layer, the crystallinity of the microcrystalline semiconductor layer can be improved by suppressing the oxygen concentration and the nitrogen concentration and by adding the impurity element serving as a donor.

Moreover, by addition of an impurity element serving as an acceptor to the microcrystalline semiconductor layer 107 at the same as or after deposition of the microcrystalline semiconductor layer 107, the threshold voltage of the transistor to be formed can be controlled. As a typical example of the impurity element serving as an acceptor, there is boron, and an impurity gas such as $B_2H_6$ or $BF_3$ may be mixed at a proportion of 1 to 1000 ppm, preferably 1 to 100 ppm into silicon hydride. Further, the concentration of boron is preferably set to be about one tenth that of the impurity element serving as a donor, e.g., $1 \times 10^{14}$ to $6 \times 10^{16}$ cm$^{-3}$.

The buffer layer 108 may be formed using an amorphous semiconductor. Alternatively, an amorphous semiconductor to which halogen such as fluorine or chlorine is added may be used. The thickness of the buffer layer 108 may be 30 to 200 nm inclusive, preferably 50 to 150 nm inclusive. As the amorphous semiconductor, amorphous silicon is given.

When the buffer layer 108 is formed using an amorphous semiconductor layer or an amorphous semiconductor layer including hydrogen, nitrogen, or halogen, native oxidation of a surface of a crystal grain included in the microcrystalline semiconductor layer can be prevented. In particular, in the microcrystalline semiconductor layer, stress concentrates in a region where the amorphous semiconductor is in contact with a crystal grain and a crack is likely to be caused. If the crack is exposed to oxygen, the crystal grain is oxidized, so that a silicon oxide layer is formed. However, by the formation of the buffer layer 108 over the surface of the microcrystalline semiconductor layer 107, the oxidation of the crystal grain can be prevented. Therefore, defects which trap carriers can be decreased and a region where the carrier movement is interrupted can be made small. Accordingly, high-speed operation of the thin film transistor becomes possible and on current can be increased.

The second insulating layer 106 is formed using silicon oxynitride. When the second insulating layer 106 is a silicon oxynitride layer, the microcrystalline semiconductor layer is provided in contact with the silicon oxynitride layer; therefore, generation of peeling of the layer or the like can be prevented. Note that the thickness of the second insulating layer 106 may be 5 to 20 nm inclusive, preferably 10 to 15 nm inclusive. This is for the purpose of facilitating the control in etching and obtaining favorable electric characteristics.

In addition, by forming the second insulating layer 106 with the use of silicon oxynitride, the crystallinity of the microcrystalline semiconductor layer 107 can be improved. Note that the second insulating layer 106 may also be formed using silicon oxide, and also in the case of the second insulating layer 106 formed using silicon oxide, the crystallinity of the microcrystalline semiconductor layer 107 is improved.

Moreover, the first insulating layer 105 is thick in a region where it is in contact with the second insulating layer 106. This is because it is difficult to ensure the sufficient etching selectivity of the second insulating layer 106 formed using silicon oxynitride with respect to the first insulating layer 105 formed using silicon nitride when the buffer layer 108, the microcrystalline semiconductor layer 107, and the second insulating layer 106 are patterned in one etching step, resulting in that the first insulating layer 105 is also etched along with the etching of the second insulating layer 106.

Note that a silicon oxynitride layer means a layer that includes more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Note that percentages of nitrogen, oxygen, silicon, and hydrogen fall within the above-described ranges, when the total number of atoms included in the silicon oxynitride layer is defined as 100 at. %.

The amorphous semiconductor layer 109 is formed using amorphous silicon. The amorphous semiconductor layer 109 may include fluorine, chlorine, or the like. When the amorphous semiconductor layer 109 includes phosphorus, the concentration of phosphorus is preferably lower in the amorphous semiconductor layer 109 than in the microcrystalline semiconductor layer 107. The part of the amorphous semiconductor layer 109 that overlaps with the wiring has a thickness of greater than or equal to 50 nm and less than 500 nm.

The amorphous semiconductor layer 109 is formed so as to cover side surfaces of the second insulating layer 106 and the microcrystalline semiconductor layer 107. In addition, the amorphous semiconductor layer 109 is formed so as to cover the buffer layer 103. The first insulating layer 105 and the amorphous semiconductor layer 109 are in contact with each other in a peripheral portion of the microcrystalline semiconductor layer 107. In such a structure, the microcrystalline semiconductor layer 107 is not in contact with the impurity semiconductor layer 110a or 110b. Therefore, it is possible to reduce leakage current between the microcrystalline semiconductor layer 107 and the impurity semiconductor layers 110a and 110b.

Further, when the amorphous semiconductor layer 109 includes phosphorus at lower concentration than the microcrystalline semiconductor layer 107, it is possible to suppress variation in threshold voltage of the transistor.

In the case of forming an n-channel thin film transistor, phosphorus may be added as the impurity element to the pair of impurity semiconductor layers 110a and 110b; in order to add phosphorus, an impurity gas such as $PH_3$ may be added to silicon hydride that is used for forming the impurity semiconductor layers 110a and 110b. In the case of forming a p-channel thin film transistor, for example, boron may be added as the impurity element; in order to add boron, an impurity gas such as $B_2H_6$ may be added to silicon hydride that is used for forming the impurity semiconductor layers 110a and 110b. When phosphorus or boron is added at a concentration of $1\times10^{19}$ to $1\times10^{21}$ cm$^{-3}$, the impurity semiconductor layers 110a and 110b can have ohmic contact with the wiring layers 111a and 111b, so that the impurity semiconductor layers 110a and 110b can serve as a source region and a drain region. The impurity semiconductor layers 110a and 110b can be formed using a microcrystalline semiconductor or an amorphous semiconductor. The impurity semiconductor layers 110a and 110b are formed to a thickness of 10 to 100 nm inclusive, preferably 30 to 50 nm inclusive. By the decrease in thickness of the impurity semiconductor layers 110a and 110b, the throughput at the time of formation is improved.

The wiring layers 111a and 111b may be formed using a conductive material, for example, a metal material. For example, aluminum, aluminum to which an element which improves heat resistance is added, or aluminum to which an element which prevents hillock is added (hereinafter the latter two aluminum is called aluminum alloy) is preferably formed as a single layer or a stack of layers. Here, as examples of the element which improves heat resistance or the element which prevents hillock, there are copper, silicon, titanium neodymium, scandium, molybdenum, and the like. Alternatively, another layered structure may be employed in which a layer which is in contact with the impurity semiconductor layer is formed using titanium, tantalum, molybdenum, tungsten, or a nitride thereof, and aluminum or an aluminum alloy is stacked thereover. Further alternatively, another layered structure may be employed in which an upper surface and a lower surface of aluminum or an aluminum alloy are covered with titanium, tantalum, molybdenum, tungsten, or a nitride thereof. For example, a stacked conductive layer in which an aluminum layer is provided over a titanium layer and another titanium layer is provided over the aluminum layer can be used.

Note that the aforementioned materials for forming the gate electrode layer 104 can be used for the wiring layers 111a and 111b, and the aforementioned materials for forming the wiring layers 111a and 111b can be used for the gate electrode layer 104.

Further, in the thin film transistor illustrated in FIG. 1A, the amorphous semiconductor layer 109 is not in contact with the wiring layer 111a or 111b, and the wiring layers 111a and 111b are provided over the amorphous semiconductor layer 109 with the pair of impurity semiconductor layers 110a and 110b interposed therebetween. Alternatively, the side surfaces of the amorphous semiconductor layer 109 may be in contact with the wiring layers 111a and 111b as illustrated in FIG. 1B. The thin film transistor illustrated in FIG. 1B can be manufactured without using a multi-tone mask.

In this embodiment, a first thin film transistor 101, a second thin film transistor 102, and a third thin film transistor 103 are connected in series to form the thin film transistor.

The first thin film transistor 101 includes the gate electrode layer 104, the first insulating layer 105, the amorphous semiconductor layer 109, the impurity semiconductor layer 110a, and the wiring layer 111a. The second thin film transistor 102 includes the gate electrode layer 104, the first insulating layer 105, the second insulating layer 106, and the microcrystalline semiconductor layer 107. The third thin film transistor 103 includes the gate electrode layer 104, the first insulating layer 105, the amorphous semiconductor layer 109, the impurity semiconductor layer 110b, and the wiring layer 111b.

In the first and third thin film transistors 101 and 103, the amorphous semiconductor layer is used for a channel formation region. In the second thin film transistor 102, the microcrystalline semiconductor layer 107 corresponds to a carrier flowing region. The microcrystalline semiconductor layer 107 preferably has an electric conductivity of 0.9 to 2 S·cm$^{-1}$ and has lower resistivity than normal amorphous semiconductor layer and microcrystalline semiconductor layer. Therefore, also when a positive voltage below the threshold voltage of the first and third thin film transistors 101 and 103 is applied to the gate electrode layer 104, a number of carriers are induced in the microcrystalline semiconductor layer 107 in the case where the first to third thin film transistors 101 to 103 are n-channel thin film transistors. When a positive voltage greater than or equal to the threshold voltage of the first and third thin film transistors 101 and 103 is applied to the gate electrode layer 104, the first and third thin film transistors 101 and 103 are turned on, so that a number of carriers induced in the microcrystalline semiconductor layer 107 flow to the wiring layer 111a of the first thin film transistor 101 or the wiring layer 111b of the third thin film transistor 103.

The channel length L of the thin film transistor of this embodiment is the sum of a distance a of the microcrystalline semiconductor layer 107 in a channel length direction, a distance b between an end of the impurity semiconductor layer 110a and an end of the microcrystalline semiconductor layer 107, and a distance c between an end of the impurity semiconductor layer 110b and an end of the microcrystalline semiconductor layer 107. The on current and mobility increase when the distance a is lengthened, and the distance b and the distance c are shortened in the channel length L.

When the distance b and the distance c are shortened, the first insulating layer 105 which serves as the gate insulating layer may be formed thinly so as not to cause a short channel effect in the second thin film transistor 102.

On the other hand, when a negative voltage is applied to the gate electrode layer 104, the first and third thin film transistors 101 and 103 are turned off even though carriers are induced in the microcrystalline semiconductor layer 107; thus, current flow can be interrupted. The first and third thin film transistors 101 and 103 are formed using the amorphous semiconductor layer and a leakage path and the like do not easily appear in the first and third thin film transistors 101 and 103; therefore, off current can be decreased.

As described above a thin film transistor with high on current, high mobility, and low off current can be obtained. Moreover, as for the thin film transistor described in this embodiment, the subthreshold swing is low, the threshold voltage does not shift or the amount of the shift is small, and the electric characteristics are favorable.

The surface (back channel) of the amorphous semiconductor layer 109 that connects the source region and the drain region is uneven, so that the distance between the source region and the drain region becomes long. Therefore, the path of leakage current flowing on the surface of the amorphous semiconductor layer 109 between the source region and the drain region is lengthened. Thus, the leakage current flowing on the surface of the amorphous semiconductor layer 109 between the source region and the drain region can be decreased so as to reduce the off current.

In addition to the insulating layer, the amorphous semiconductor layer 109 is provided between the gate electrode layer 104 and the impurity semiconductor layers 110a and 110b. Therefore, there is a long distance between the gate electrode layer 104 and the impurity semiconductor layers 110a and 110b. As a result, generation of the parasitic capacitance caused between the gate electrode layer 104 and the impurity semiconductor layers 110a and 110b can be decreased.

Embodiment 2

In Embodiment 2, examples of a structure of a thin film transistor according to an embodiment of the present invention, which are different from those of Embodiment 1, will be described with reference to FIGS. 2A and 2B. Note that the description about the same portions as those in Embodiment 1 will be omitted.

Figure 2A:
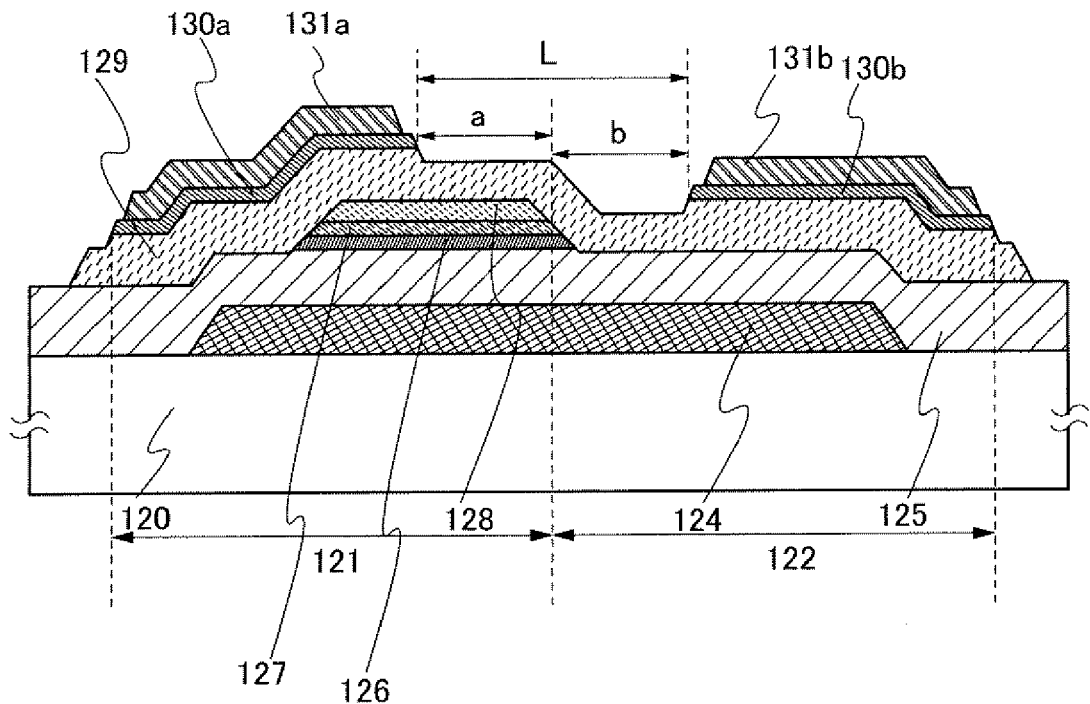
FIGS. 2A and 2B each illustrate a thin film transistor.
Figure 2B:
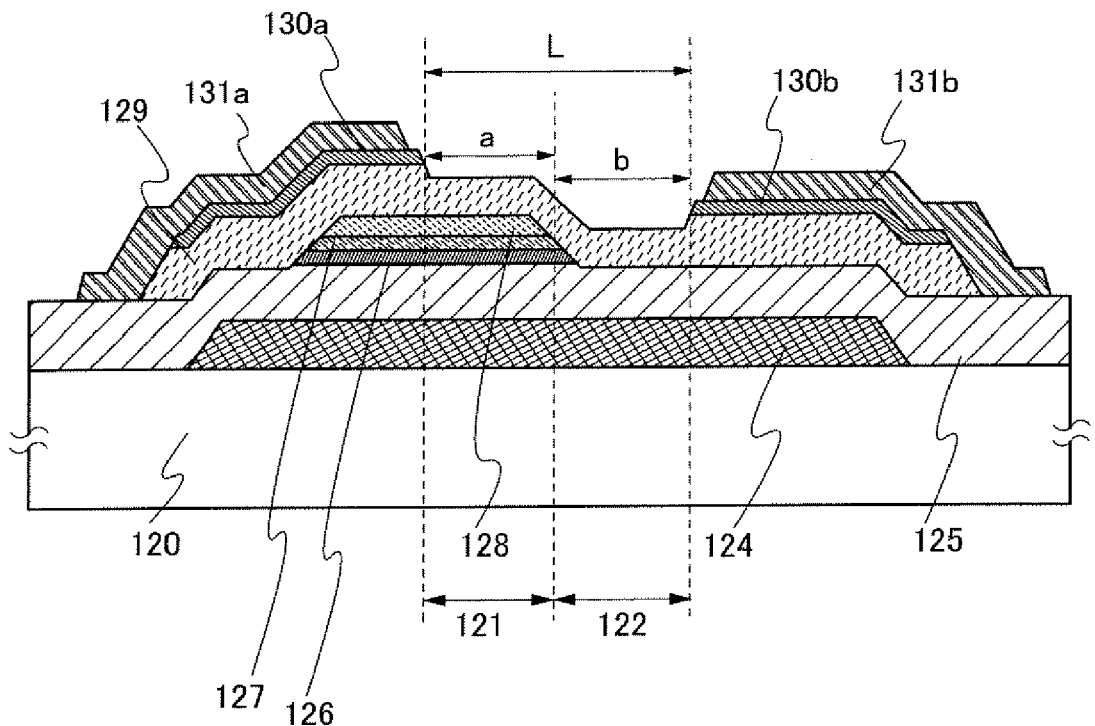

A thin film transistor illustrated in FIG. 2A includes a gate electrode layer 124 which is provided over a substrate 120; a first insulating layer 125 which is provided so as to cover the gate electrode layer 124; an impurity semiconductor layer 130a and an impurity semiconductor layer 130b forming a source region and a drain region, which are provided with a distance therebetween and which at least partly overlap with the gate electrode layer 124; a microcrystalline semiconductor layer 127 which is provided over the first insulating layer 125 in part of a channel formation region, and which at least partly overlaps with the gate electrode layer 124 and one of the impurity semiconductor layers 130a and 130b and does not overlap with the other of the impurity semiconductor layers 130a and 130b; a second insulating layer 126 which is provided between and in contact with the first insulating layer 125 and the microcrystalline semiconductor layer 127; and an amorphous semiconductor layer 129 which is provided over the first insulating layer 125 so as to cover the second insulating layer 126 and the microcrystalline semiconductor layer 127.

Specifically, the thin film transistor illustrated in FIG. 2A includes the gate electrode layer 124 which is provided over the substrate 120; the first insulating layer 125 which is provided so as to cover the gate electrode layer 124; the amorphous semiconductor layer 129 which is provided over the first insulating layer 125 so as to be at least partly in contact with the first insulating layer 125; the impurity semiconductor layer 130a and the impurity semiconductor layer 130b forming a source region and a drain region, which are provided with a distance therebetween over the amorphous semiconductor layer 129; the microcrystalline semiconductor layer 127 which is provided between the first insulating layer 125 and the amorphous semiconductor layer 129 in part of the channel formation region, and which at least partly overlaps with the gate electrode layer 124 and one of the impurity semiconductor layers 130a and 130b and does not overlap with the other of the impurity semiconductor layers 130a and 130b; and the second insulating layer 126 which is provided between and in contact with the first insulating layer 125 and the microcrystalline semiconductor layer 127.

In other words, the thin film transistor illustrated in FIG. 2A includes the gate electrode layer 124; the first insulating layer 125 which is provided so as to cover the gate electrode layer 124; the microcrystalline semiconductor layer 127 which is provided over the first insulating layer 125 and which at least partly overlaps with the gate electrode layer 124; the amorphous semiconductor layer 129 which is provided so as to cover at least the microcrystalline semiconductor layer 127; the impurity semiconductor layer 130a and the impurity semiconductor layer 130b forming a source region and a drain region, which are provided over the amorphous semiconductor layer 129 such that one of the impurity semiconductor layers 130a and 130b overlaps with the microcrystalline semiconductor layer 127 and the other does not overlap with the microcrystalline semiconductor layer 127; and the second insulating layer 126 which is provided between and in contact with the first insulating layer 125 and the microcrystalline semiconductor layer 127.

Note that a buffer layer 128 is provided over the microcrystalline semiconductor layer 127 in FIG. 2A as a preferable mode.

Further, a wiring layer 131a and a wiring layer 131b are provided over the impurity semiconductor layer 130a and the impurity semiconductor layer 130b, respectively.

Each layer in the thin film transistor illustrated in FIG. 2A will be described below.

As the substrate 120, the same substrate as the substrate 100 in Embodiment 1 can be used.

The gate electrode layer 124 can be formed with a material and a method similar to those of the gate electrode layer 104 in Embodiment 1 to substantially the same thickness as that of the gate electrode layer 104. In addition, end portions of the gate electrode layer 124 are preferably processed to be tapered, similarly to the gate electrode layer 104. By the same manufacturing steps as those of the gate electrode layer 124, not only a gate wiring but also a capacitor wiring can be formed.

The first insulating layer 125 is formed using silicon nitride, similarly to the first insulating layer 105 in Embodiment 1. When the first insulating layer 125 is a silicon nitride layer, there are the following advantages: the subthreshold swing of the thin film transistor can be reduced; the adhesion between the substrate 120 and the first insulating layer 125 can be increased: and impurity elements such as sodium included in the substrate 120 can be prevented from entering the microcrystalline semiconductor layer 127, the buffer layer 128, and the amorphous semiconductor layer 129. Furthermore, oxidation of the gate electrode layer 124 can be prevented The first insulating layer 125 is preferably formed to a thickness of 50 to 150 nm inclusive, similarly to the first insulating layer 105 in Embodiment 1. The gate electrode layer 124 is generally formed by a sputtering method and the surface thereof is likely to be uneven. The first insulating layer 125 having a thickness of 50 to 150 nm inclusive makes it possible to suppress reduction in coverage due to the unevenness.

Therefore, by forming the first insulating layer 125 using silicon nitride having a thickness of 50 to 150 nm inclusive, peeling of the layer can be prevented, whereby electric characteristics of a thin film transistor which is formed later can be favorable.

The microcrystalline semiconductor layer 127 is formed using a microcrystalline semiconductor and the resistivity thereof is preferably in the range of 0.9 to 2 S·cm$^{-1}$, similarly to the microcrystalline semiconductor layer 107 in Embodiment 1.

The same microcrystalline semiconductor as that described in Embodiment 1 is also used in this embodiment.

The thickness of the microcrystalline semiconductor layer 127 may be 5 to 50 nm inclusive, preferably 5 to 30 nm inclusive.

It is preferable that an impurity element serving as a donor be added to the microcrystalline semiconductor layer 127 in order to obtain sufficient on current.

Moreover, similarly to the case of the microcrystalline semiconductor layer 107 in Embodiment 1, by addition of an impurity element serving as an acceptor to the microcrystalline semiconductor layer 127 at the same as or after deposition of the microcrystalline semiconductor layer 127, the threshold voltage of the transistor to be formed can be controlled.

The buffer layer 128 is formed using an amorphous semiconductor, similarly to the buffer layer 108 in Embodiment 1. Alternatively, an amorphous semiconductor layer to which halogen such as fluorine or chlorine is added may be used. The thickness of the buffer layer 128 may be 30 to 200 nm inclusive, preferably 50 to 150 nm inclusive. As the amorphous semiconductor, amorphous silicon can be used.

When the buffer layer 128 is formed using an amorphous semiconductor layer or an amorphous semiconductor layer including hydrogen, nitrogen, or halogen, native oxidation of a surface of the crystal grain of the microcrystalline semiconductor layer can be prevented. Therefore, defects which trap carriers can be decreased and a region where the carrier movement is interrupted can be made small. Accordingly, high-speed operation of the thin film transistor becomes possible and on current can be increased.

The second insulating layer 126 is formed using silicon oxynitride, similarly to the second insulating layer 106 in Embodiment 1. The second insulating layer 126 may be formed to a thickness of 5 to 20 nm inclusive, preferably 10 to 15 nm inclusive. By forming the second insulating layer 126 with the use of silicon oxynitride, the crystallinity of the microcrystalline semiconductor layer 127 can be improved.

Moreover, the first insulating layer 125 is thick in a region where it is in contact with the second insulating layer 126. This is because it is difficult to ensure the sufficient etching selectivity of the second insulating layer 126 formed using silicon oxynitride with respect to the first insulating layer 125 formed using silicon nitride when the buffer layer 128, the microcrystalline semiconductor layer 127, and the second insulating layer 126 are patterned in one etching step, resulting in that the first insulating layer 125 is also etched along with the etching of the second insulating layer 126.

The amorphous semiconductor layer 129 is formed using amorphous silicon. The amorphous semiconductor layer 129 may include fluorine, chlorine, or the like. When the amorphous semiconductor layer 129 includes phosphorus, the concentration of phosphorus is preferably lower in the amorphous semiconductor layer 129 than in the microcrystalline semiconductor layer 127. The part of the amorphous semiconductor layer 129 that overlaps with the wiring has a thickness of greater than or equal to 50 nm and less than 500 nm.

The amorphous semiconductor layer 129 covers side surfaces of the second insulating layer 126 and the microcrystalline semiconductor layer 127. In addition, the amorphous semiconductor layer 129 is formed so as to cover the buffer layer 128. The first insulating layer 125 and the amorphous semiconductor layer 129 are in contact with each other in a peripheral portion of the microcrystalline semiconductor layer 127. In such a structure, the microcrystalline semiconductor layer 127 is not in contact with the impurity semiconductor layer 130a or 130b. Therefore, it is possible to reduce leakage current between the microcrystalline semiconductor layer 127 and the impurity semiconductor layers 130a and 130b.

Further, when the amorphous semiconductor layer 129 includes phosphorus at lower concentration than the microcrystalline semiconductor layer 127, it is possible to suppress variation in threshold voltage of the transistor.

In the case of forming an n-channel thin film transistor, phosphorus may be added as the impurity element to the pair of impurity semiconductor layers 130a and 130b. In the case of forming a p-channel thin film transistor, boron may be added as the impurity element to the pair of impurity semiconductor layers 130a and 130b. The impurity semiconductor layers 130a and 130b are formed to a thickness of 10 to 100 nm inclusive, preferably 30 to 50 nm inclusive.

The wiring layers 131a and 131b can be formed with a material and a method similar to those of the wiring layers 111a and 111b in Embodiment 1 to substantially the same thickness as that of the wiring layers 111a and 111b.

Further, in the thin film transistor illustrated in FIG. 2A, the amorphous semiconductor layer 129 is not in contact with the wiring layer 131a or 131b, and the wiring layers 131a and 131b are provided over the amorphous semiconductor layer 129 with the pair of impurity semiconductor layers 130a and 130b interposed therebetween. Alternatively, the side surfaces of the amorphous semiconductor layer 129 may be in contact with the wiring layers 131a and 131b as illustrated in FIG. 2B. The thin film transistor illustrated in FIG. 2B can be manufactured without using a multi-tone mask.

In this embodiment, a first thin film transistor 121 and a second thin film transistor 122 are connected in series to form the thin film transistor.

The first thin film transistor 121 includes the gate electrode layer 124, the first insulating layer 125, the second insulating layer 126, the microcrystalline semiconductor layer 127, the amorphous semiconductor layer 129, the impurity semiconductor layer 130a, and the wiring layer 131a. The second thin film transistor 122 includes the gate electrode layer 124, the first insulating layer 125, the amorphous semiconductor layer 129, the impurity semiconductor layer 130b, and the wiring layer 131b.

In the second thin film transistor 122, the amorphous semiconductor layer is used for a channel formation region. In the first thin film transistor 121, the microcrystalline semiconductor layer 127 corresponds to a carrier flowing region. The microcrystalline semiconductor layer 127 has an electric conductivity of 0.9 to 2 S·cm$^{-1}$ and has lower resistivity than normal amorphous semiconductor layer and microcrystalline semiconductor layer. Therefore, in the case where the first and second thin film transistors 121 and 122 are n-channel thin film transistors even while a positive voltage below the threshold voltage of the second thin film transistor 122 is applied to the gate electrode layer 124, a number of carriers are induced in the microcrystalline semiconductor layer 127. When a positive voltage greater than or equal to the threshold voltage of the second thin film transistor 122 is applied to the gate electrode layer 124, the second thin film transistor 122 is turned on, so that a number of carriers induced in the microcrystalline semiconductor layer 127 flow to the wiring layer 131a of the first thin film transistor 121 or the wiring layer 131b of the second thin film transistor 122.

The channel length L of the thin film transistor of this embodiment is the sum of a distance a between an end of the impurity semiconductor layer 130a and an end of the microcrystalline semiconductor layer 127 and a distance b between an end of the impurity semiconductor layer 130b and an end of the microcrystalline semiconductor layer 127. The on current and mobility increase when the distance a is lengthened, and the distance b is shortened in the channel length L.

When the distance b is shortened, the first insulating layer 125 which serves as a gate insulating layer may be formed thinly so as not to cause a short channel effect in the second thin film transistor 122.

On the other hand, when a negative voltage is applied to the gate electrode layer 124, the second thin film transistor 122 is turned off even though carriers are induced in the microcrystalline semiconductor layer 127; thus, current flow can be interrupted. The second thin film transistor 122 is formed using the amorphous semiconductor layer and a leakage path and the like do not appear in the second thin film transistor 122; therefore, off current can be decreased.

As described above, the thin film transistor with high on current, high mobility, and low off current can be obtained. Moreover, as for the thin film transistor described in this embodiment, the subthreshold swing is low, the threshold voltage does not shift or the amount of the shift is small, and the electric characteristics are favorable.

The surface (back channel) of the amorphous semiconductor layer 129 that connects the source region and the drain region is uneven, so that the distance between the source region and the drain region becomes long. Therefore, the path of leakage current flowing on the surface of the amorphous semiconductor layer 129 between the source region and the drain region is lengthened. Thus, the leakage current flowing on the surface of the amorphous semiconductor layer 129 between the source region and the drain region can be decreased so as to reduce the off current.

In addition to the insulating layer, the amorphous semiconductor layer 129 is provided between the gate electrode layer 124 and the impurity semiconductor layers 130a and 130b. Therefore, there is a long distance between the gate electrode layer 124 and the impurity semiconductor layers 130a and 130b. As a result, generation of the parasitic capacitance caused between the gate electrode layer 124 and the impurity semiconductor layers 130a and 130b can be decreased.

Embodiment 3

In Embodiment 3, a method for manufacturing the thin film transistor described in Embodiment 1, which is the thin film transistor illustrated in FIG. 1A, will be described with reference to FIG. 3, FIGS. 4A to 4E, FIGS. 5A to 5E, and FIGS. 6A and 6B. Note that a method for manufacturing the thin film transistor illustrated in FIG. 2A is similar to that of the thin film transistor illustrated in FIG. 1A.

An n-channel thin film transistor including an amorphous semiconductor layer or a microcrystalline semiconductor layer has higher field-effect mobility than a p-channel one and thus is more suitable for being used for a driver circuit. In addition, it is preferable that thin film transistors be manufactured to have the same polarity over the same substrate because the number of manufacturing steps is reduced. Therefore, in this embodiment, a method for manufacturing an n-channel thin film transistor will be described. Note that a p-type thin film transistor can be manufactured in a manner similar to the n-channel thin film transistor.

Figure 3:
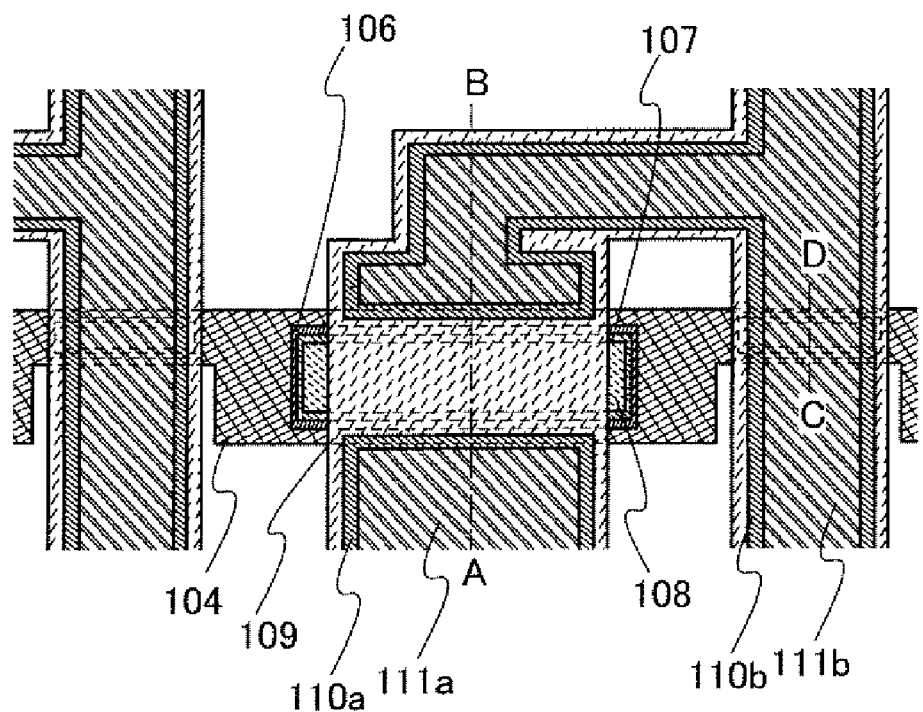
FIG. 3 illustrates a manufacturing method of a thin film transistor.

FIGS. 4A to 4E each illustrates a cross-sectional view taken along line A-B in FIG. 3, and FIGS. 5A to 5E each illustrates a cross-sectional view taken along line C-D in FIG. 3.

Figure 4A:
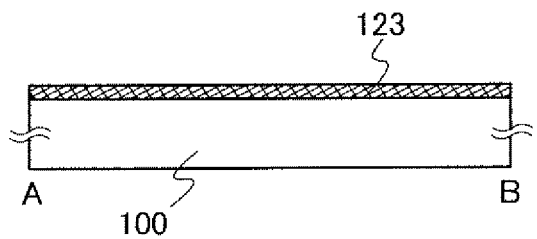
FIGS. 4A to 4E illustrate the manufacturing method of the thin film transistor.
Figure 5A:
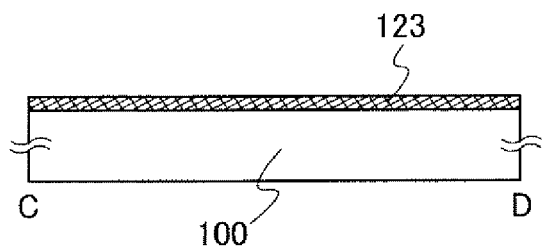
FIGS. 5A to 5E illustrate the manufacturing method of the thin film transistor.

First, a conductive layer 123 is formed over a substrate 100 (FIG. 4A and FIG. 5A). As a material of the conductive layer 123, any of the materials for the gate electrode layer 104 described in Embodiment 1 can be used. The conductive layer 123 is formed by a sputtering method, a CVD method, a plating method, a printing method, a droplet discharge method, or the like.

Next, a resist is applied to the conductive layer 123, and a resist mask is formed through a photolithography step using a first photomask. The conductive layer 123 is etched into a desired shape with use of the resist mask, whereby the gate electrode layer 104 is formed. After that, the resist mask is removed.

Then, an insulating layer 132 which is to be the first insulating layer 105 is formed over the substrate 100 and the gate electrode layer 104. The insulating layer 132 is formed using silicon nitride as described in Embodiment 1 by a CVD method, a sputtering method, or the like.

Figure 4B:
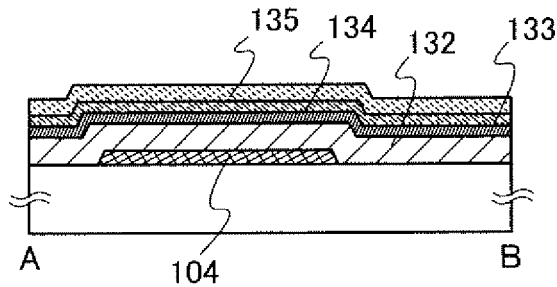
Figure 5B:
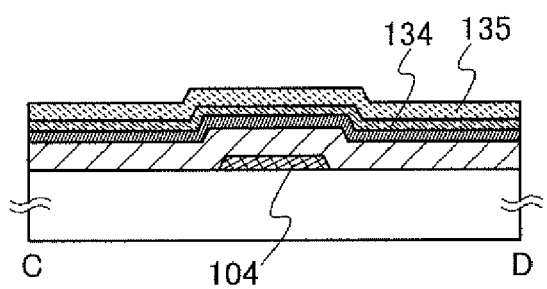

Then, an insulating layer 133 which is to be the second insulating layer 106, a microcrystalline semiconductor layer 134 which is to be the microcrystalline semiconductor layer 107, and a buffer layer 135 which is to be the buffer layer 108 are stacked over the insulating layer 132 (FIG. 4B and FIG. 5B). As described in Embodiment 1, it is preferable to add an impurity element serving as a donor to the microcrystalline semiconductor layer 134. The microcrystalline semiconductor layer 134 is formed by the following method.

The microcrystalline semiconductor layer 134 can be formed by glow discharge plasma using a mixture of hydrogen and a deposition gas including silicon, in a reaction chamber of a plasma CVD apparatus. The microcrystalline semiconductor layer can be formed using the mixture obtained by diluting the deposition gas including silicon with hydrogen which has the flow rate of 10 to 2000 times, preferably 50 to 200 times that of the deposition gas including silicon. The treatment is performed while the substrate is heated to 100 to 300° C., preferably 120 to 220° C. When a gas including phosphorus, arsenic, antimony, or the like is mixed into the above-described source gas, an impurity element serving as a donor can be added to the microcrystalline semiconductor layer. Here, phosphine is mixed into a mixed gas of silane, hydrogen, and a rare gas (or a nixed gas of silane and one of hydrogen and a rare gas), and glow discharge plasma is used, whereby a microcrystalline silicon layer including phosphorus is formed.

In this embodiment, glow discharge plasma can be generated by application of, for example, high-frequency power with a frequency of 1 to 20 MHz (typically 13.56 MHz), or high-frequency power with a frequency of 20 to approximately 120 MHz (typically 27.12 or 60 MHz).

As typical examples of the deposition gas including silicon, there are $SiH_4$, $Si_2H_6$, and the like.

The impurity element serving as a donor may also be added to the insulating layer 133 instead of being directly added to the microcrystalline semiconductor layer 134 to form a microcrystalline semiconductor layer including the impurity element serving as a donor. Alternatively, the impurity element serving as a donor may be added to the insulating layer 132. Further alternatively, the impurity element serving as a donor may be added to both the insulating layer 132 and the insulating layer 133. Further still alternatively, the impurity element serving as a donor may be added to one or both of the insulating layer 132 and the insulating layer 133 while the impurity element serving as a donor is added to the microcrystalline semiconductor layer 134 in formation of the microcrystalline semiconductor layer 134.

In order to form an insulating layer to which the impurity element serving as a donor is added as the insulating layer 132, the insulating layer may be formed using a mixture of a gas which includes the impurity element serving as a donor and a source gas used for forming the insulating layer. For example, silicon nitride including phosphorus can be formed by a plasma CVD method using silane, ammonia, and phosphine. Further, in the case of forming an insulating layer to which the impurity element serving as a donor is added as the insulating layer 133, a silicon oxynitride layer including phosphorus can be formed by a plasma CVD method using silane, dinitrogen monoxide, ammonia, and phosphine. Alternatively, a gas including the impurity element serving as a donor may be supplied to the reaction chamber prior to the formation of these layers, so that the impurity element serving as a donor may be adsorbed onto the surface of the substrate 100 and the inner wall of the reaction chamber. After that, the layers are formed, whereby the semiconductor layer can be formed while taking in the impurity element serving as a donor. In formation of the insulating layer 133, the impurity element serving as a donor may also be adsorbed onto the surface of the insulating layer 132.

Further, the surface of the insulating layer 133 is preferably subjected to plasma treatment. The plasma treatment can be performed in such a manner that the surface of the insulating layer 133 is exposed to plasma typified by hydrogen plasma, ammonia plasma, $H_2O$ plasma, helium plasma, argon plasma, or neon plasma. As a result, the number of defects at the surface of the insulating layer 133 can be decreased. This is because the dangling bond at the surface of the insulating layer 133 can be terminated by this treatment.

Next, the buffer layer 135 to be the buffer layer 108 is formed. The buffer layer 135 is formed using an amorphous semiconductor layer. The amorphous semiconductor layer may be formed by a plasma CVD method using a deposition gas including silicon. Alternatively, the amorphous semiconductor layer can be formed using a deposition gas including silicon which is diluted with one or more kinds of rare gas elements selected from helium, argon, krypton, and neon. When a mixture obtained by diluting the deposition gas including silicon with hydrogen which has the flow rate of 0 to 50 times, preferably 0 to 10 times, more preferably 2 to 5 times that of the deposition gas including silicon is used, the amorphous semiconductor layer can be formed. More specifically, when the flow rate of hydrogen is 1 to 10 times, preferably 1 to 5 times that of a silane gas, an amorphous semiconductor layer including hydrogen can be formed. Further, halogen such as fluorine or chlorine may be added to the gas.

The amorphous semiconductor layer can also be formed by performing sputtering in hydrogen or a rare gas using a silicon target.

The buffer layer 135 is preferably formed by a plasma CVD method at a temperature of 300 to 400° C. Through this process, hydrogen is supplied to the microcrystalline semiconductor layer 134, and the effect similar to hydrogenation of the microcrystalline semiconductor layer 134 can be obtained. That is to say, when the buffer layer 135 is formed under the above condition over the microcrystalline semiconductor layer to which the impurity element serving as a donor is added, hydrogen can be diffused to the microcrystalline semiconductor layer 134 to terminate the dangling bond.

By the provision of the buffer layer 135, native oxidation of the surface of the crystal grain included in the microcrystalline semiconductor layer can be prevented.

The buffer layer 135 may include hydrogen, nitrogen, or halogen. In particular, in a region where the amorphous semiconductor layer and the crystal grain of the microcrystalline semiconductor layer are in contact with each other, a crack is likely to be caused due to local stress. If the crack is exposed to oxygen, the crystal grain is oxidized, so that a silicon oxide layer is formed. However, by the provision of the buffer layer 135, the oxidation of the microcrystal grain of the microcrystalline semiconductor layer can be prevented. Furthermore, when the thickness of the buffer layer 135 is increased, the withstanding voltage of the thin film transistor is also increased; therefore, it is possible to prevent the thin film transistor from deteriorating due to high voltage.

Figure 4C:
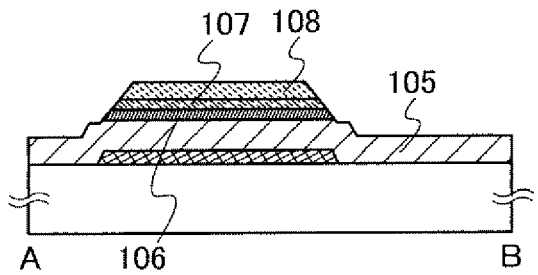
Figure 5C:
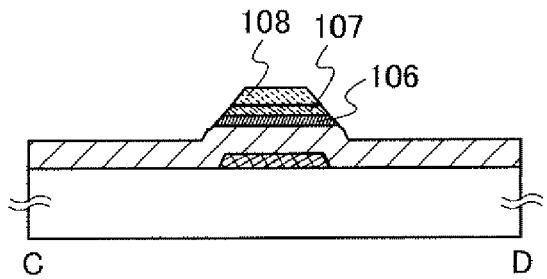

Next, after a resist is applied to the buffer layer 135, a resist mask is formed through a photolithography process using a second photomask. With the use of this resist mask, the buffer layer 135 is etched into a desired shape, so that the buffer layer 108 is formed in a region where the thin film transistor is formed (FIG. 4C and FIG. 5C). After that, the resist mask is removed. When the buffer layer 135 is etched, part of the microcrystalline semiconductor layer 134 may also be etched.

After the resist mask is removed, the microcrystalline semiconductor layer 134 and the insulating layer 133 are etched using the buffer layer 108 as a mask, thereby forming the microcrystalline semiconductor layer 107 and the second insulating layer 106 (FIG. 4C and FIG. 5C). In this step, not only is the second insulating layer 106 formed but also the first insulating layer 105 is formed because part of the insulating layer 132 that does not overlap with the buffer layer 108 is also etched.

The microcrystalline semiconductor layer 107 may also be formed by etching the microcrystalline semiconductor layer 134 without removing the resist mask which is used for forming the buffer layer 108.

Next, an amorphous semiconductor layer 136 and an impurity semiconductor layer 137 are formed.

The amorphous semiconductor layer 136 can be formed using a material and a method which are similar to those of the buffer layer 135.

The amorphous semiconductor layer 136 is formed as follows: the inner wall of the reaction chamber of the plasma CVD apparatus is pre-coated with any of a silicon nitride oxide layer, a silicon nitride layer, a silicon oxide layer, and a silicon oxynitride layer and then, a semiconductor layer is formed using a mixture obtained by diluting a deposition gas including silicon with hydrogen which has the flow rate of 0 to 50 times, preferably 0 to 10 times, more preferably 2 to 5 times that of the deposition gas including silicon. Thus, the semiconductor layer is deposited while taking in oxygen, nitrogen, and the like existing in the inner wall of the chamber; therefore, a dense amorphous semiconductor layer can be formed without being crystallized. However, part of the amorphous semiconductor layer 136 may include crystal grains. Since the first insulating layer 105 is a silicon nitride layer, by forming the amorphous semiconductor layer 136 by the above method, the layer can be prevented from being peeled and the yield can be increased.

In this embodiment, an n-channel thin film transistor is formed. Therefore, the impurity semiconductor layer 137 to which an impurity element imparting one conductivity type is added can be formed by a plasma CVD method using a phosphine gas and a deposition gas including silicon. In the case of forming a p-channel thin film transistor, a plasma CVD method using diborane and a deposition gas including silicon can be used.

In the steps of forming the microcrystalline semiconductor layer 134, the buffer layer 135, the amorphous semiconductor layer 136, and the impurity semiconductor layer 137, the glow discharge plasma can be generated by applying, for example, high-frequency power with a frequency of 1 to 20 MHz (typically 13.56 MHz) or high-frequency power with a frequency of 20 to about 120 MHz (typically 27.12 or 60 MHz).

A conductive layer 138 can be formed using any of the materials for the wiring layers 111a and 111b which are described in Embodiment 1. The conductive layer 138 is formed by a CVD method, a sputtering method, a printing method, a droplet discharge method, or the like. Although the conductive layer 138 is formed as a single layer in FIGS. 4D and 4E, a plurality of conductive layers may be stacked to form the conductive layer 138 in a manner similar to Embodiment 1.

Then, a resist is applied to the conductive layer 138. As the resist, a positive type resist or a negative type resist can be used. Here, the case of using a positive type resist is described.

Figure 4D:
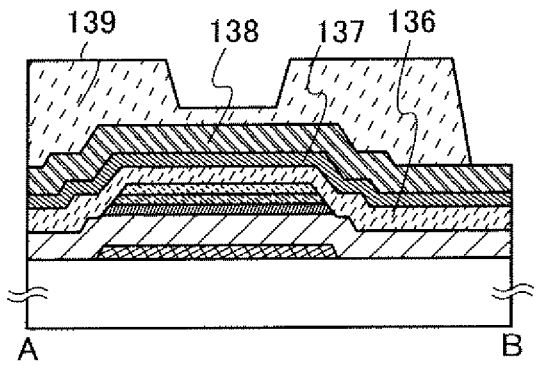
Figure 5D:
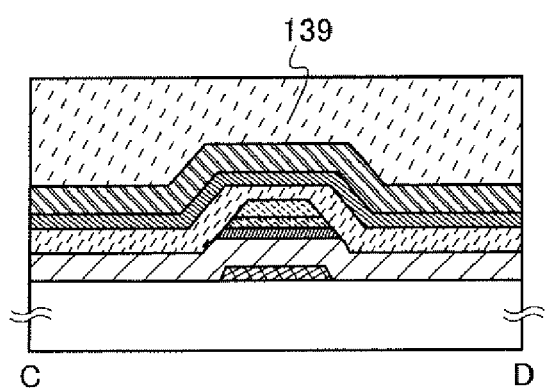

Next, the resist is irradiated with light with the use of a multi-tone mask as a third photomask and then developed, thereby forming a resist mask 139 (FIG. 4D and FIG. 5D).

The resist mask 139 can be formed using a general multi-tone mask. Here, a multi-tone mask is described below with reference to FIGS. 6A and 6B.

A multi-tone mask allows light exposure with multilevel amount of light. Typically, the light exposure can be performed with three levels of amount of light to form an exposed region, a half-exposed region, and an unexposed region. By one light exposure and development step with the use of a multi-tone mask, a resist mask with plural thicknesses (typically, two kinds of thicknesses) can be formed. Thus, the use of a multi-tone mask can reduce the number of photomasks.

FIGS. 6A and 6B are cross-sectional views of typical multi-tone masks. FIG. 6A illustrates a gray-tone mask 150 and FIG. 6B illustrates a half-tone mask 155.

The gray-tone mask 150 in FIG. 6A includes a light-blocking portion 152 formed using a light-blocking film and a diffraction grating portion 153 formed by a pattern of the light-blocking film, which are provided on a light-transmitting substrate 151.

The diffraction grating portion 153 has slits, dots, meshes, or the like that are provided at intervals which are less than or equal to the resolution limit of light used for the light exposure, whereby the amount of light transmittance can be controlled. Note that the diffraction grating portion 153 may have slits, dots, or meshes with periodic or nonperiodic intervals.

For the light-transmitting substrate 151, quartz or the like can be used. The light-blocking film for the light-blocking portion 152 and the diffraction grating portion 153 may be formed using a metal film; preferably, chromium, chromium oxide, or the like is used.

When the gray-tone mask 150 is irradiated with light for the light exposure, the transmittance of a region overlapping with the light-blocking portion 152 is 0% and that of a region where neither the light-blocking portion 152 nor the diffraction grating portion 153 is provided is 100%, as illustrated in FIG. 6A. Further, the transmittance of the diffraction grating portion 153 is approximately 10 to 70%, which can be adjusted by the intervals or the like of the slits, dots, or meshes of the diffraction grating.

The half-tone mask 155 illustrated in FIG. 6B includes a semi-light-transmitting portion 157 formed using a semi-light-transmitting film and a light-blocking portion 158 formed using a light-blocking film which are provided on a light-transmitting substrate 156.

The semi-light-transmitting portion 157 can be formed using a film of MoSiN, MoSi, MoSiO, MoSiON, CrSi, or the like. The light-blocking portion 158 may be formed using a metal film similar to the light-blocking film of the gray-tone mask; preferably, chromium, chromium oxide, or the like is used.

When the half-tone mask 155 is irradiated with light for the light exposure, the transmittance of a region overlapping with the light-blocking portion 158 is 0% and that of a region where neither the light-blocking portion 158 nor the semi-light-transmitting portion 157 is provided is 100%, as illustrated in FIG. 6B. Further, the transmittance of the semi-light-transmitting portion 157 is approximately 10 to 70%, which can be adjusted by the kind, the thickness, or the like of a material used.

After the light exposure using the multi-tone mask is performed, development is carried out, whereby a resist mask having regions with different thicknesses can be formed.

Figure 4E:
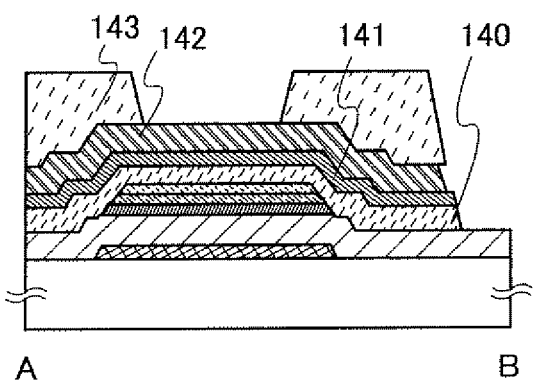
Figure 5E:
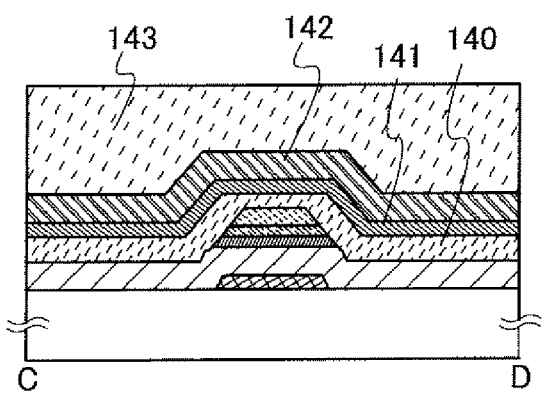

Next, the amorphous semiconductor layer 136, the impurity semiconductor layer 137 to which the impurity imparting one conductivity type is added, and the conductive layer 138 are etched with the use of the resist mask 139. As a result, an amorphous semiconductor layer 140, an impurity semiconductor layer 141 to which the impurity imparting one conductivity type is added, and a conductive layer 142 can be formed (FIG. 4E and FIG. 5E).

Next, a resist mask 143 is formed by reducing the size of the resist mask 139. For example, ashing with the use of oxygen plasma may be performed in order to reduce the size of the resist mask 139. When the resist mask 139 is reduced in size, the area of the resist mask and the thickness thereof are decreased. At this time, the resist in a region with small thickness (a region overlapping with part of the gate electrode layer 104) is removed to form a separated resist mask 143, as illustrated in FIG. 4E.

Next, the conductive layer 142 is etched to be separated with the use of the resist mask 143, whereby the wiring layers 111a and 111b can be formed. When the conductive layer 142 is etched with the use of the resist mask 143 by wet etching, the ends of the conductive layer 142 are etched selectively. As a result, since the conductive layer 142 is isotropically etched, the wiring layers 111a and 111b each with a smaller area than the resist mask 143 can be formed.

At the intersection of the gate electrode layer 104 and the wiring layer 111a (at the position of the cross section along C-D in FIG. 3), the second insulating layer 106, the microcrystalline semiconductor layer 107, the buffer layer 108, and the amorphous semiconductor layer 140 are formed in addition to the first insulating layer 105. Thus, the distance between the gate electrode layer 104 and the wiring layer 111a can be lengthened. Therefore, the parasitic capacitance in a region where the gate electrode layer 104 intersects with the wiring layer 111a can be decreased.

Next, the impurity semiconductor layer 141 to which the impurity element imparting one conductivity type is added is etched with the use of the resist mask 143 so as to form the pair of impurity semiconductor layers 110a and 110b. Note that part of the amorphous semiconductor layer 140 is also etched in this etching step, thereby forming the amorphous semiconductor layer 109.

Here, the ends of the wiring layers 111a and 111b do not align with the ends of the impurity semiconductor layers 110a and 110*b*, and the ends of the impurity semiconductor layers 110*a* and 110*b* are located outside of the ends of the wiring layers 111*a* and 111*b*. After that, the resist mask 143 is removed.

After the removal of the resist mask 143, 112 plasma treatment is preferably performed. The $H_2O$ plasma treatment can be performed typically in such a manner that plasma discharge is performed in an atmosphere containing vaporized water to generate radicals and a surface to be irradiated is irradiated with the radicals. When the $H_2O$ plasma treatment is performed on the amorphous semiconductor layer 109, the pair of impurity semiconductor layers 110*a* and 110*b*, and the wiring layers 111*a* and 111*b*, the thin film transistor can operate at high speed and the on current thereof can be further increased. Furthermore, the off current can be decreased. Without limitation to this treatment, various treatments may be performed on the back channel portion for removing a residue of the resist mask or the like.

Through these steps, the thin film transistor illustrated in FIG. 1A can be manufactured. The thin film transistor manufactured in the aforementioned manner has low off current and high on current, and can operate at high speed. Further, an element substrate including the thin film transistor as a switching element for a pixel electrode can be manufactured. In this embodiment, the microcrystalline semiconductor layer and the buffer layer are etched into predetermined shapes; therefore, the number of photomasks that are used is increased by one, compared to a method for manufacturing a general inverted-staggered thin film transistor. However, a multi-tone mask is used as the photomask in etching the amorphous semiconductor layer, the impurity semiconductor layer, and the wiring layer into predetermined shapes; therefore, as a whole, the thin film transistor can be manufactured without increasing the number of masks compared to a method for manufacturing a conventional thin film transistor that does not use a multi-tone mask.

Figure 1B:
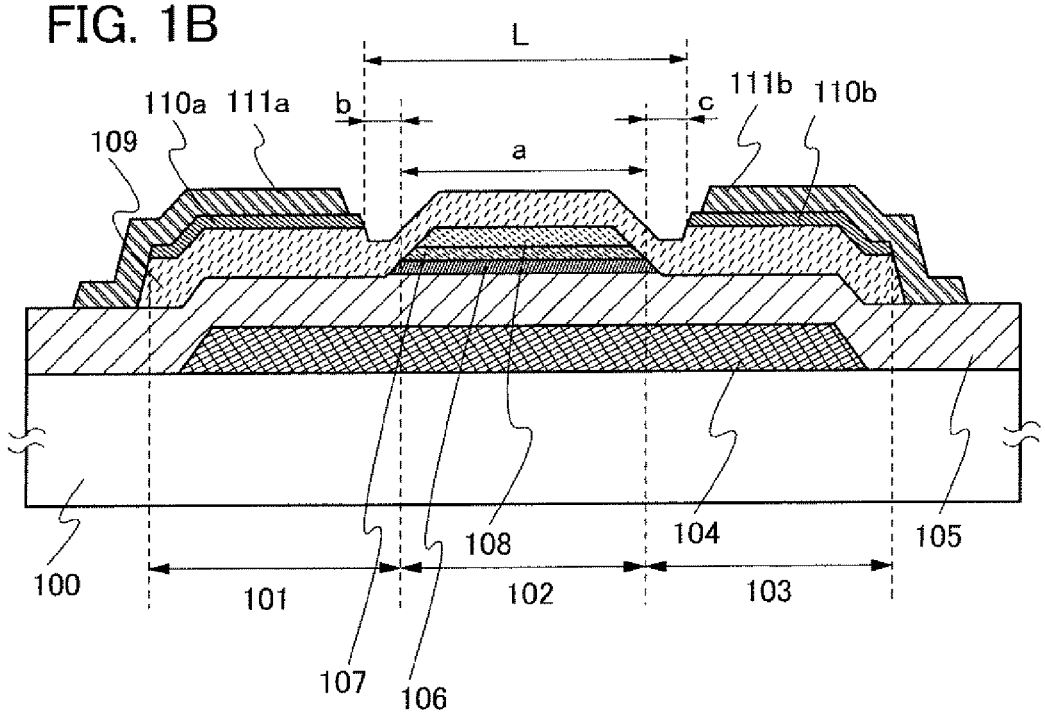

Note that the thin film transistor illustrated in FIG. 1B can be manufactured without using a multi-tone mask. An manufacturing method of a thin film transistor without using a multi-tone mask will be described with reference to FIGS. 7A to 7D.

Figure 7A:
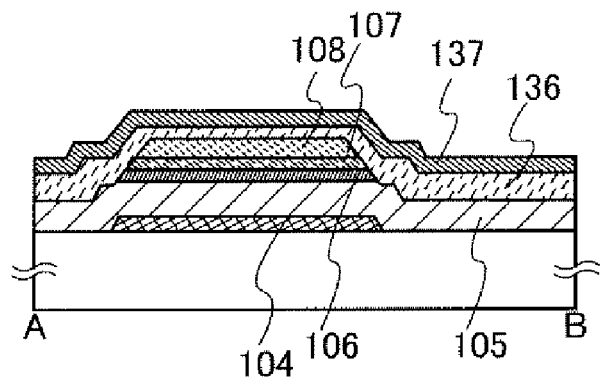
FIGS. 7A to 7D illustrate a manufacturing method of a thin film transistor.
Figure 7B:
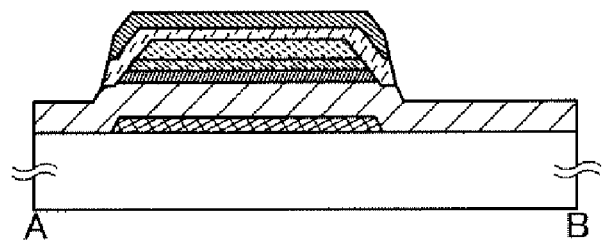
Figure 7C:
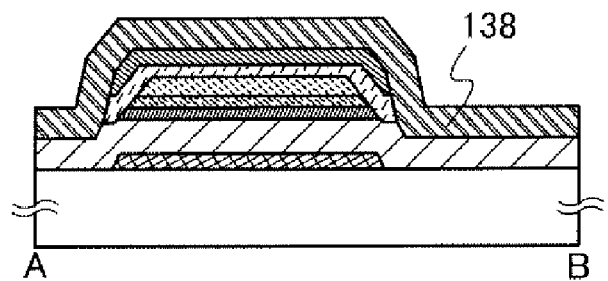
Figure 7D:
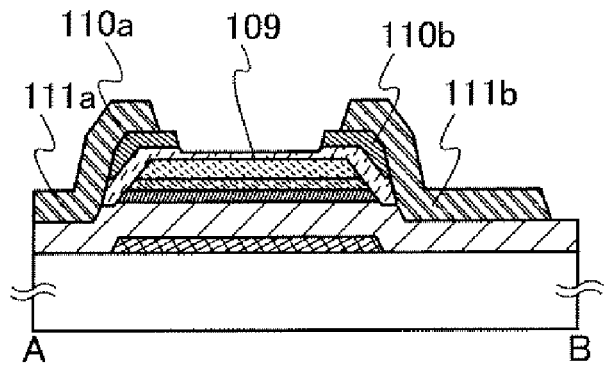
Figure 8A:
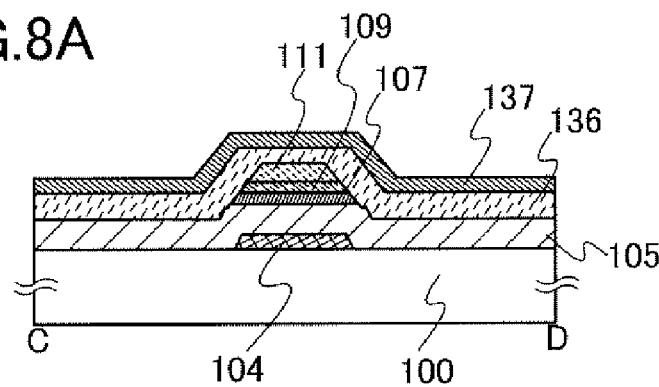
FIGS. 8A to 8D illustrate the manufacturing method of the thin film transistor.
Figure 8B:
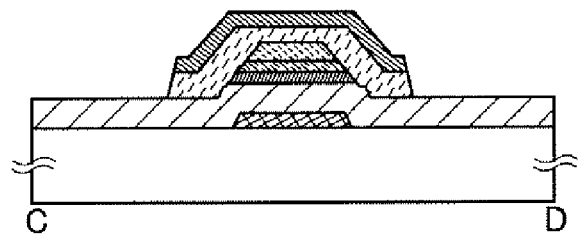
Figure 8C:
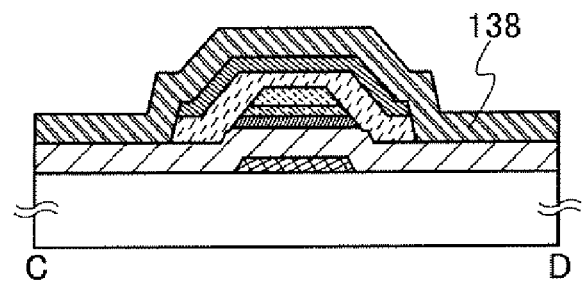
Figure 8D:
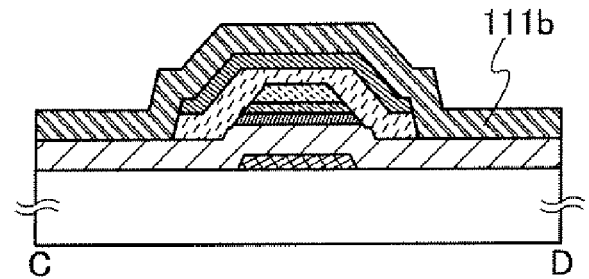

First, the second insulating layer 106, the microcrystalline semiconductor layer 107, and the buffer layer 108 are formed over the first insulating layer 105 which is provided so as to cover the gate electrode layer 104. After that, the amorphous semiconductor layer 136 and the impurity semiconductor layer 137 are formed so as to cover these layers (FIG. 7A). A resist mask is formed over the impurity semiconductor layer 137, and the layers are etched to have island shapes (FIG. 7B). The conductive layer 138 is formed over the impurity semiconductor layer which is etched to have an island shape (FIG. 7C). Then, the conductive layer 138 is etched to have a desired pattern, and then, part of the amorphous semiconductor layer 136 and the impurity semiconductor layer 137 are etched, so that a thin film transistor can be formed (FIG. 7D). Note that the thin film transistor illustrated in FIG. 2B can also be manufactured in a manner similar to the above.

Figure 9:
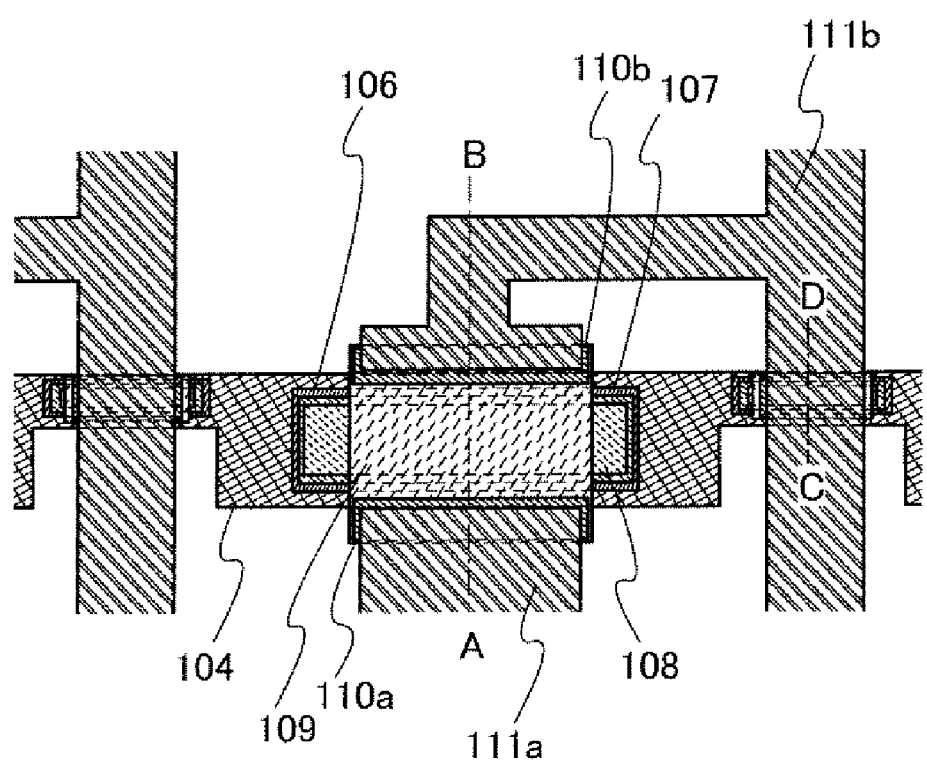
FIG. 9 illustrates the manufacturing method of the thin film transistor.

FIG. 9 is a top view like FIG. 3. FIGS. 7A to 7D each illustrates a cross-sectional view taken along line A-B in FIG. 9. FIGS. 8A to 8D illustrate a manufacturing method regarding a portion where the gate electrode layer 104 and the wiring layer 111*a* intersect with each other. FIGS. 8A to 8D each illustrates a cross-sectional view taken along line C-D in FIG. 9.

Embodiment 4

An active matrix substrate for a liquid crystal display device can be manufactured using any of the thin film transistors described in Embodiments 1 and 2.

First, an insulating layer is formed so as to cover any of the thin film transistors illustrated in FIGS. 1A and 1B and FIGS. 2A and 2B. Then, an opening is provided in the insulating layer so as to reach a source electrode or a drain electrode of the thin film transistor, and a pixel electrode layer is formed so as to be connected to the source electrode or the drain electrode of the thin film transistor through the opening Next, a manufacturing method of a liquid crystal display device using the active matrix substrate for a display device, which is manufactured through the above-described steps, will be described. That is, a cell process and a module process will be described. Note that the cell process and the module process are not limited to a particular process, in the manufacturing method of a display device in this embodiment.

In the cell process, the active matrix substrate manufactured through the above-described steps and a substrate opposite to the active matrix substrate (hereinafter referred to as an opposite substrate) are attached to each other and liquid crystal is injected therebetween. First, a manufacturing method of the opposite substrate will be briefly described below. Note that a film formed on the opposite substrate may be a single layer or stacked layer also when not particularly mentioned.

First, a light-blocking layer is formed over a substrate; a color filter layer for any of red, green, and blue is formed over the light-blocking layer; a pixel electrode layer is selectively formed over the color filter; and then, a rib is formed over the pixel electrode layer.

As the light-blocking layer, a film of a light-blocking material is selectively formed. As the light-blocking material, for example, an organic resin including a black resin (carbon black) can be used. Alternatively, a stacked film which includes a film of a material including chromium as its main component may be used. The film of a material including chromium as its main component means a film including chromium, chromium oxide, or chromium nitride. The material used for the light-blocking layer is not limited to a particular material as long as it has a light-blocking property. In order to selectively form the film of a light-blocking material, a photolithography method or the like is employed.

The color filter layer may be selectively formed using an organic resin film which can transmit only light of any of red, green, and blue when white light from a backlight passes through the color filter layer. The color filter layer can be selectively formed by selective formation of a material for any of red, green, and blue. The arrangement of the color filters may be a stripe arrangement, a delta arrangement, or a square arrangement.

The pixel electrode layer can be formed over the opposite substrate in a manner similar to the pixel electrode layer formed over the active matrix substrate. Note that since selective formation is not necessary, the pixel electrode layer may be formed over the entire surface of the opposite substrate.

The rib formed over the pixel electrode is an organic resin film formed with a pattern for the purpose of widening the viewing angle. Note that the rib does not need to be formed if not particularly necessary.

As a manufacturing method of the opposite substrate, there are other various modes. For example, after formation of the color filter layer and before formation of the pixel electrode layer, an overcoat layer may be formed. By formation of the overcoat layer, planarity of a surface on which the pixel electrode is formed can be improved, thereby increasing yield. In addition, part of a material included in the color filter layer can be prevented from entering a liquid crystal material. For the overcoat layer, a thermosetting material including an acrylic resin or an epoxy resin as a base is used.

Further, before or after formation of the rib, post spacers (columnar spacers) may be formed as spacers. The post spacers mean structural objects formed at a constant interval on the opposite substrate in order to keep the gap between the active matrix substrate and the opposite substrate constant. In the case of using bead spacers (spherical spacers), the post spacers need not be formed.

Next, an alignment film is formed over each of the active matrix substrate and the opposite substrate. The alignment film is formed, for example, in such a manner that a polyimide resin or the like is melted in an organic solvent; this solution is applied by a printing method, a spin coating method, or the like; and then the organic solvent is removed and the substrate is baked. The thickness of the formed alignment film is generally approximately 50 to 100 nm inclusive. Rubbing treatment is performed on the alignment film to align liquid crystal molecules with a certain pretilt angle. The rubbing treatment is performed, for example, by rubbing the alignment film with a shaggy cloth such as velvet.

Then, the active matrix substrate and the opposite substrate are attached to each other with a sealant. In the case where the post spacers are not provided on the opposite substrate, bead spacers may be dispersed in a desired region, and the active matrix substrate and the opposite substrate may be attached to each other.

Next, a liquid crystal material is injected into a space between the active matrix substrate and the opposite substrate, which are attached to each other After injection of the liquid crystal material, an inlet for injection is sealed with an ultraviolet curing resin or the like. Alternatively, after dripping a liquid crystal material to either the active matrix substrate or the opposite substrate, the substrates may be attached.

Next, a polarizing plate is attached to each of surfaces of a liquid crystal cell, which is formed by attachment of the active matrix substrate and the opposite substrate. Then, the cell process is finished.

Next, as the module process, a flexible printed circuit (FPC) is connected to an input terminal of a terminal portion. The FPC has a wiring formed of a conductive film over an organic resin film of polyimide or the like, and is connected to the input terminal through an anisotropic conductive paste (hereinafter referred to as an ACP). The ACP includes a paste functioning as an adhesive and particles plated with gold or the like to have a conductive surface, which have a diameter of several tens of μm to several hundreds of μm. When the particles mixed in the paste are in contact with the conductive layer over the input terminal and the conductive layer over the terminal connected to the wiring formed in the FPC, electric connection therebetween is achieved. Alternatively, after connection of the FPC, a polarizing plate may be attached to each of the active matrix substrate and the opposite substrate. In the above-described manner, a liquid crystal panel used for a display device can be manufactured.

Embodiment 5

In this embodiment, electronic devices in which a display panel or a display device manufactured by the method described in Embodiment 4 is incorporated as a display portion will be described with reference to FIGS. 10A and 10B, FIG. 11, and FIGS. 12A to 12C. As such electronic devices, for example, cameras such as video cameras or digital cameras; head mounted displays (goggle type displays); car navigation systems; projectors; car stereos; personal computers; and portable information terminals (such as mobile computers, mobile phones, and e-book readers) can be given. Specific examples of them are illustrated in FIGS. 10A and 10B.

Figure 10A:
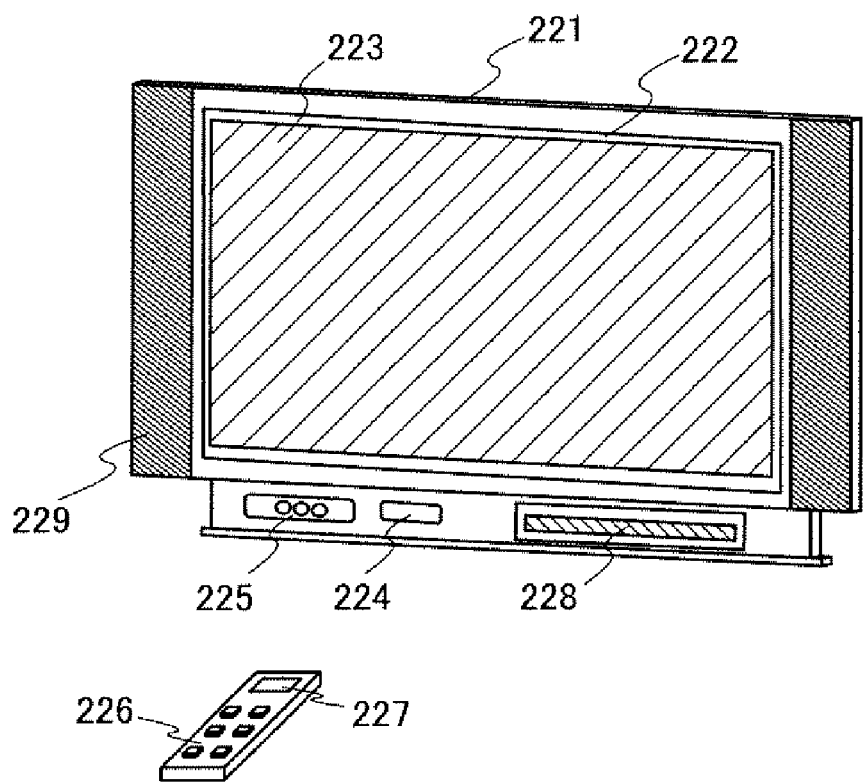
FIGS. 10A and 10B each illustrate an example of an electronic device.
Figure 10B:
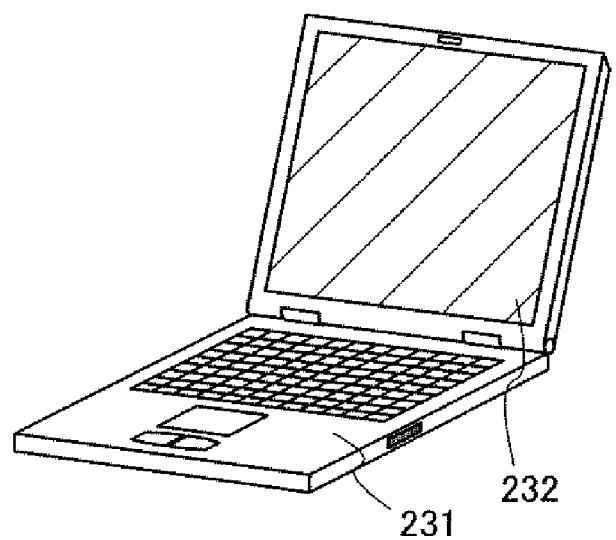

FIG. 10A illustrates a television device. The television device illustrated in FIG. 10A can be completed by incorporating a display panel into a housing. A main screen 223 is formed using the display panel described in Embodiment 4, and speaker portions 229, operation switches, and the like are provided as its accessory equipment.

As illustrated in FIG. 10A, the display panel described in Embodiment 4 is incorporated into a housing 221, and general TV broadcast can be received by a receiver 225. When the television device is connected to a communication network by wired or wireless connections via a modem 224, one-way (from a sender to a receiver) or two-way (between a sender and a receiver or between receivers) information communication can be performed. The television device can be operated using switches incorporated in the housing or by a remote control device 226 provided separately. A display portion 227 which displays information which is output may be provided also for the remote control device 226.

Further, the television device may include a sub-screen 228 formed using a second display panel for displaying channels, volume, and the like, in addition to the main screen 223.

FIG. 11 is a block diagram of a main structure of a television device. A pixel portion 251 is formed in a display panel. A signal line driver circuit 252 and a scanning line driver circuit 253 may be mounted on the display panel by a COG method.

As structures of other external circuits, a video signal amplifier circuit 255 amplifying a video signal among signals received by a tuner 254, a video signal processing circuit 256 converting signals output from the video signal amplifier circuit 255 into chrominance signals corresponding to colors of red, green, and blue, a control circuit 257 for converting the video signal into a signal which meets input specifications of a driver IC, and the like are provided on the input side of the video signal. The control circuit 257 outputs signals to each of the scanning line side and the signal line side. In the case of digital drive, a signal dividing circuit 258 may be provided on the signal line side and an input digital signal may be divided into integer number of pieces and supplied.

Among the signals received by the tuner 254, audio signals are transmitted to an audio signal amplifier circuit 259, and an output thereof is supplied to a speaker 263 through an audio signal processing circuit 260. A control circuit 261 receives control information on receiving station (receiving frequency) and volume from an input portion 262 and transmits signals to the tuner 254 and the audio signal processing circuit 260.

Naturally, the display device is not limited to be applied to the television device and can also be applied to a large-sized display medium such as an information display board at a train station, an airport, and the like, or an advertisement display board on the street, as well as a monitor of a personal computer. The image quality and the like of these display media can be improved and the power consumption can be reduced.

When the display panel or the display device manufactured by the manufacturing method of a display device described in Embodiment 4 is applied to the main screen 223 or the sub-screen 228, the image quality of the television device can be improved and power consumption thereof can be reduced.

A portable computer illustrated in FIG. 10B includes a main body 231, a display portion 232, and the like. By using the display panel or the display device manufactured by the manufacturing method of a display device described in Embodiment 4, the image quality of the display portion of the computer can be improved and power consumption thereof can be reduced.

Figure 12A:
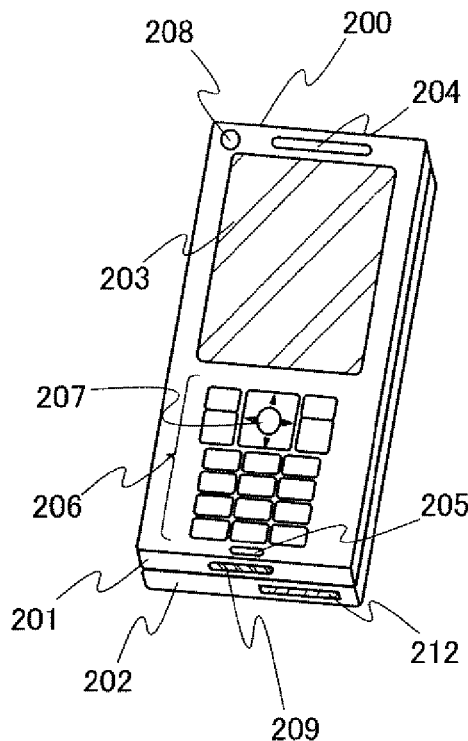
FIGS. 12A to 12C illustrate an example of an electronic device.
Figure 12B:
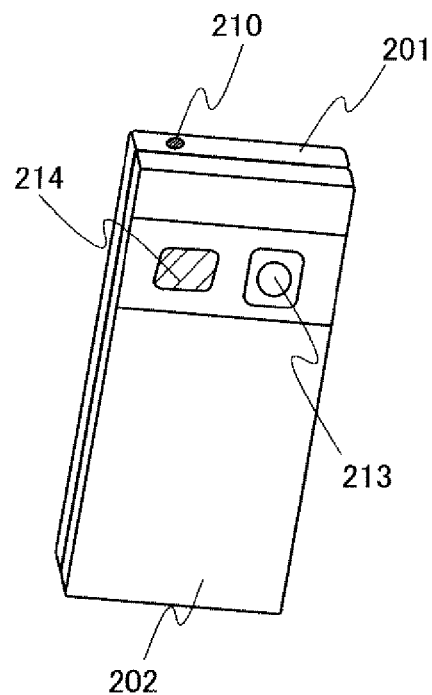
Figure 12C:
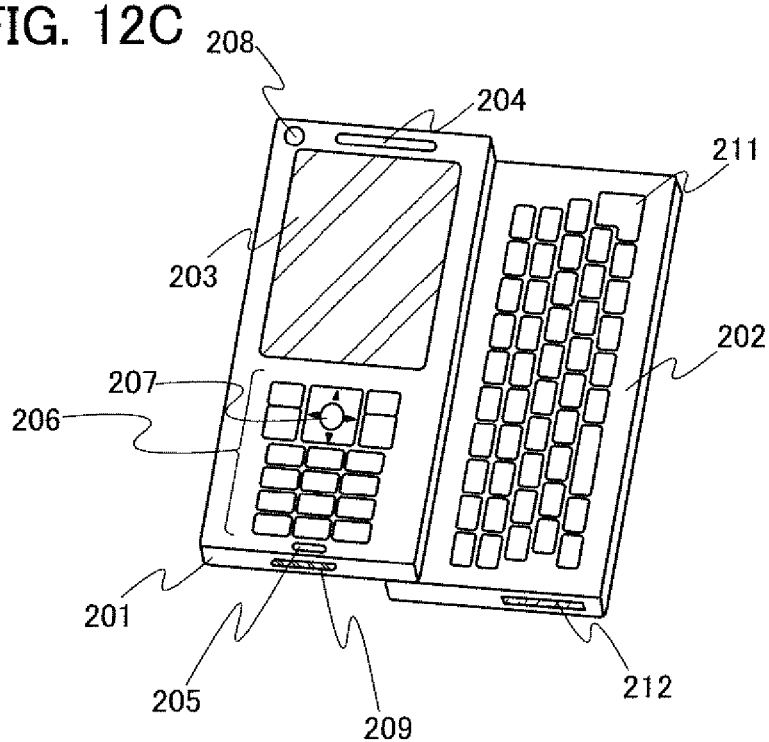

FIGS. 12A to 12C illustrate an example of a mobile phone. FIG. 12A is a front view, FIG. 12B is a rear view, and FIG. 12C is a front view when two housings are slid. A mobile phone 200 includes two housings 201 and 202. The mobile phone 200 is a so-called smartphone which has both a function of a mobile phone and a function of a portable information terminal, and incorporates a computer and can process a variety of data processing in addition to voice calls.

The mobile phone 200 includes the housings 201 and 202. The housing 201 includes a display portion 203, a speaker 204, a microphone 205, operation keys 206, a pointing device 207, a front camera lens 208, a jack 209 for an external connection terminal, an earphone terminal 210, and the like, while the housing 202 includes a keyboard 211, an external memory slot 212, a rear camera 213, a light 214, and the like. In addition, an antenna is incorporated in the housing 201.

In addition to the above-described structure, a non-contact IC chip, a small-size memory device, or the like may be incorporated in the mobile phone 200.

The housings 201 and 202 overlapped with each other (illustrated in FIG. 12A) can slide and be developed by sliding as illustrated in FIG. 12C. The display panel or the display device manufactured by the manufacturing method of a display device described in Embodiment 4 can be incorporated in the display portion 203. Since the display portion 203 and the front camera lens 208 are provided in the same plane, the mobile phone 200 can be used as a videophone. A still image and a moving image can be taken by the rear camera 213 and the light 214 by using the display portion 203 as a viewfinder.

By using the speaker 204 and the microphone 205, the mobile phone 200 can be used as an audio recording device (sound recorder) or an audio reproducing device. With use of the operation keys 206, operation of incoming and outgoing calls, simple information input for electronic mail or the like, scrolling of a screen displayed on the display portion, cursor motion for selecting information to be displayed on the display portion, and the like are possible.

If much information needs to be handled, such as the case of creating documents and using the mobile phone 200 as a portable information terminal, the use of the keyboard 211 is convenient. By sliding the housings 201 and 202 which overlap with each other (FIG. 12A), the housings 201 and 202 can be developed as illustrated in FIG. 12C. In the case where the mobile phone 200 is used as a portable information terminal, smooth operation can be performed with the keyboard 211 and the pointing device 207. The jack 209 for an external connection terminal can be connected to various cables such as an AC adapter or a USB cable, whereby the mobile phone 200 can be charged or can perform data communication with a personal computer or the like. Moreover, by inserting a recording medium into the external memory slot 212, the mobile phone 200 can store and move a large amount of data.

In the rear surface of the housing 202 (FIG. 12B), the rear camera 213 and the light 214 are provided, and a still image and a moving image can be taken by using the display portion 203 as a viewfinder.

Further, the mobile phone 200 may have an infrared communication function, a USB port, a function of receiving one segment television broadcast, a non-contact IC chip, an earphone jack, or the like, in addition to the above-described functions and structures.

The electronic devices described in this embodiment can be manufactured by employing the manufacturing method of the thin film transistor and the display device described in Embodiment 1 and the like, and thus, on current can be increased and off current can be reduced. Therefore, by employing the present invention, the image quality of display portions of these electronic devices (such as a contrast) can be improved and power consumption thereof can be reduced.

This application is based on Japanese Patent Application serial no. 2008-134343 filed with Japan Patent Office on May 22, 2008, the entire contents of which are hereby incorporated by reference.

What is claimed is:

1. A thin film transistor comprising:
   a gate electrode layer;
   a first insulating layer which is provided so as to cover the gate electrode layer;
   a pair of impurity semiconductor layers forming a source region and a drain region, which are provided with a distance therebetween and which at least partly overlap with the gate electrode layer;
   a microcrystalline semiconductor layer which is provided over the first insulating layer in part of a channel formation region and which at least partly overlaps with the gate electrode layer and does not overlap with the pair of impurity semiconductor layers;
   a second insulating layer which is provided between and in contact with the first insulating layer and the microcrystalline semiconductor layer; and
   an amorphous semiconductor layer which is provided over the first insulating layer so as to cover the second insulating layer and the microcrystalline semiconductor layer,
   wherein the first insulating layer is a silicon nitride layer and the second insulating layer is a silicon oxynitride layer.

2. The thin film transistor according to claim 1, wherein the first insulating layer is thick in a region where the first insulating layer overlaps with the second insulating layer.

3. The thin film transistor according to claim 2, wherein a side surface of the microcrystalline semiconductor layer and a side surface of the second insulating layer are substantially aligned with each other.

4. The thin film transistor according to claim 1, wherein the microcrystalline semiconductor layer comprises an impurity element serving as a donor.

5. The thin film transistor according to claim 1, wherein the amorphous semiconductor layer is an amorphous silicon layer.

6. A display device comprising the thin film transistor according to claim 1.

7. A thin film transistor comprising:
   a gate electrode layer;
   a first insulating layer which is provided so as to cover the gate electrode layer;
   an amorphous semiconductor layer which is provided over the first insulating layer so as to be at least partly in contact with the first insulating layer;
   a pair of impurity semiconductor layers forming a source region and a drain region, which are provided with a distance therebetween over the amorphous semiconductor layer;
   a microcrystalline semiconductor layer which is provided between the first insulating layer and the amorphous semiconductor layer in part of a channel formation region and which at least partly overlaps with the gate electrode layer and does not overlap with the pair of impurity semiconductor layers; and a second insulating layer which is provided between and in contact with the first insulating layer and the microcrystalline semiconductor layer, wherein the first insulating layer is a silicon nitride layer and the second insulating layer is a silicon oxynitride layer.

8. The thin film transistor according to claim 7, wherein the first insulating layer is thick in a region where the first insulating layer overlaps with the second insulating layer.

9. The thin film transistor according to claim 8, wherein a side surface of the microcrystalline semiconductor layer and a side surface of the second insulating layer are substantially aligned with each other.

10. The thin film transistor according to claim 7, wherein the microcrystalline semiconductor layer comprises an impurity element serving as a donor.

11. The thin film transistor according to claim 7, wherein the amorphous semiconductor layer is an amorphous silicon layer.

12. A display device comprising the thin film transistor according to claim 7.

13. A thin film transistor comprising:
a gate electrode layer;
a first insulating layer which is provided so as to cover the gate electrode layer;
a microcrystalline semiconductor layer which is provided over the first insulating layer and which at least partly overlaps with the gate electrode layer;
an amorphous semiconductor layer which is provided so as to cover at least the microcrystalline semiconductor layer;
a pair of impurity semiconductor layers forming a source region and a drain region, which are provided over the amorphous semiconductor layer and which do not overlap with the microcrystalline semiconductor layer; and
a second insulating layer which is provided between and in contact with the first insulating layer and the microcrystalline semiconductor layer,
wherein the first insulating layer is a silicon nitride layer and the second insulating layer is a silicon oxynitride layer.

14. The thin film transistor according to claim 13, wherein the first insulating layer is thick in a region where the first insulating layer overlaps with the second insulating layer.

15. The thin film transistor according to claim 14, wherein a side surface of the microcrystalline semiconductor layer and a side surface of the second insulating layer are substantially aligned with each other.

16. The thin film transistor according to claim 13, wherein the microcrystalline semiconductor layer comprises an impurity element serving as a donor.

17. The thin film transistor according to claim 13, wherein the amorphous semiconductor layer is an amorphous silicon layer.

18. A display device comprising the thin film transistor according to claim 13.

19. A thin film transistor comprising:
a gate electrode layer;
a first insulating layer which is provided so as to cover the gate electrode layer;
a pair of impurity semiconductor layers forming a source region and a drain region, which are provided with a distance therebetween and which at least partly overlap with the gate electrode layer;
a microcrystalline semiconductor layer which is provided over the first insulating layer in part of a channel formation region and which at least partly overlaps with the gate electrode layer and one of the pair of impurity semiconductor layers and does not overlap with the other of the pair of impurity semiconductor layers;
a second insulating layer which is provided between and in contact with the first insulating layer and the microcrystalline semiconductor layer; and
an amorphous semiconductor layer which is provided over the first insulating layer so as to cover the second insulating layer and the microcrystalline semiconductor layer,
wherein the first insulating layer is a silicon nitride layer and the second insulating layer is a silicon oxynitride layer.

20. The thin film transistor according to claim 19, wherein the first insulating layer is thick in a region where the first insulating layer overlaps with the second insulating layer.

21. The thin film transistor according to claim 20, wherein a side surface of the microcrystalline semiconductor layer and a side surface of the second insulating layer are substantially aligned with each other.

22. The thin film transistor according to claim 19, wherein the microcrystalline semiconductor layer comprises an impurity element serving as a donor.

23. The thin film transistor according to claim 19, wherein the amorphous semiconductor layer is an amorphous silicon layer.

24. A display device comprising the thin film transistor according to claim 19.

25. A thin film transistor comprising:
a gate electrode layer;
a first insulating layer which is provided so as to cover the gate electrode layer;
an amorphous semiconductor layer which is provided over the first insulating layer so as to be at least partly in contact with the first insulating layer;
a pair of impurity semiconductor layers forming a source region and a drain region, which are provided with a distance therebetween over the amorphous semiconductor layer;
a microcrystalline semiconductor layer which is provided between the first insulating layer and the amorphous semiconductor layer in part of a channel formation region and which at least partly overlaps with the gate electrode layer and one of the pair of impurity semiconductor layers and does not overlap with the other of the pair of impurity semiconductor layers; and
a second insulating layer which is provided between and in contact with the first insulating layer and the microcrystalline semiconductor layer,
wherein the first insulating layer is a silicon nitride layer and the second insulating layer is a silicon oxynitride layer.

26. The thin film transistor according to claim 25, wherein the first insulating layer is thick in a region where the first insulating layer overlaps with the second insulating layer.

27. The thin film transistor according to claim 26, wherein a side surface of the microcrystalline semiconductor layer and a side surface of the second insulating layer are substantially aligned with each other.

28. The thin film transistor according to claim 25, wherein the microcrystalline semiconductor layer comprises an impurity element serving as a donor.

29. The thin film transistor according to claim 25, wherein the amorphous semiconductor layer is an amorphous silicon layer.

30. A display device comprising the thin film transistor according to claim 25.

31. A thin film transistor comprising:
a gate electrode layer;
a first insulating layer which is provided so as to cover the gate electrode layer;
a microcrystalline semiconductor layer which is provided over the first insulating layer and which at least partly overlaps with the gate electrode layer;
an amorphous semiconductor layer which is provided so as to cover at least the microcrystalline semiconductor layer;
a pair of impurity semiconductor layers forming a source region and a drain region, which are provided over the amorphous semiconductor layer such that one of the pair of impurity semiconductor layers overlaps with the microcrystalline semiconductor layer and the other does not overlap with the microcrystalline semiconductor layer; and
a second insulating layer which is provided between and in contact with the first insulating layer and the microcrystalline semiconductor layer,
wherein the first insulating layer is a silicon nitride layer and the second insulating layer is a silicon oxynitride layer.

32. The thin film transistor according to claim 31, wherein the first insulating layer is thick in a region where the first insulating layer overlaps with the second insulating layer.

33. The thin film transistor according to claim 32, wherein a side surface of the microcrystalline semiconductor layer and a side surface of the second insulating layer are substantially aligned with each other.

34. The thin film transistor according to claim 31, wherein the microcrystalline semiconductor layer comprises an impurity element serving as a donor.

35. The thin film transistor according to claim 31 wherein the amorphous semiconductor layer is an amorphous silicon layer.

36. A display device comprising the thin film transistor according to claim 31.

* * * * *